United States Patent
Fujii

(10) Patent No.: US 9,755,069 B2
(45) Date of Patent: *Sep. 5, 2017

(54) SEMICONDUCTOR DEVICE

(71) Applicant: Renesas Electronics Corporation, Tokyo (JP)

(72) Inventor: Hiroki Fujii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/140,888

(22) Filed: Apr. 28, 2016

(65) Prior Publication Data

US 2016/0240664 A1 Aug. 18, 2016

Related U.S. Application Data

(63) Continuation of application No. 14/619,194, filed on Feb. 11, 2015, now Pat. No. 9,356,138.

(30) Foreign Application Priority Data

Feb. 27, 2014 (JP) .................................. 2014-036944

(51) Int. Cl.
*H01L 29/78* (2006.01)
*H01L 29/06* (2006.01)
(Continued)

(52) U.S. Cl.
CPC ...... *H01L 29/7825* (2013.01); *H01L 29/0653* (2013.01); *H01L 29/0696* (2013.01);
(Continued)

(58) Field of Classification Search
CPC ........... H01L 29/4236; H01L 29/42376; H01L 29/407; H01L 29/0878; H01L 29/66704;
(Continued)

(56) References Cited

U.S. PATENT DOCUMENTS 6,861,702 B2   3/2005 Kitamura
8,357,986 B2   1/2013 Wang et al.
(Continued)

FOREIGN PATENT DOCUMENTS

JP   2003-31804 A    1/2003
JP   2005-183633 A   7/2005
(Continued)

OTHER PUBLICATIONS

Yu-Hui Huang et al., Investigation of Multistage Linear Region Drain Current Degradation and Gate-Oxide Breakdown Under Hot-Carrier Stress in BCD HV PMOS, Proc. of IRPS' 11, pp. 444-448. (2011).

(Continued)

*Primary Examiner* — Evan Pert
*Assistant Examiner* — Changhyun Yi
(74) *Attorney, Agent, or Firm* — Mattingly & Malur, PC

(57) ABSTRACT

There is provided a semiconductor device having LDMOS transistors embedded in a semiconductor substrate to boost source-drain breakdown voltage, with arrangements to prevent fluctuations of element characteristics caused by electric field concentration so that the reliability of the semiconductor device is improved. A trench is formed over the upper surface of a separation insulating film of each LDMOS transistor, the trench having a gate electrode partially embedded therein. This structure prevents electric field concentration in the semiconductor substrate near the source-side edge of the separation insulating film.

13 Claims, 39 Drawing Sheets

(51) Int. Cl.
*H01L 29/66* (2006.01)
*H01L 29/10* (2006.01)
*H01L 29/40* (2006.01)
*H01L 29/423* (2006.01)

(52) U.S. Cl.
CPC ...... *H01L 29/1083* (2013.01); *H01L 29/1095* (2013.01); *H01L 29/407* (2013.01); *H01L 29/4236* (2013.01); *H01L 29/42376* (2013.01); *H01L 29/66659* (2013.01); *H01L 29/66704* (2013.01); *H01L 29/7816* (2013.01); *H01L 29/7835* (2013.01)

(58) Field of Classification Search
CPC ........... H01L 29/0653; H01L 29/42368; H01L 29/402; H01L 29/7825
USPC ........... 257/408, E29.001, E21.631; 438/278
See application file for complete search history.

(56) References Cited

U.S. PATENT DOCUMENTS

| | | | |
|---|---|---|---|
| 8,692,325 B2 | 4/2014 | Yanagi | |
| 9,356,138 B2 * | 5/2016 | Fujii | H01L 29/7816 |
| 2009/0256212 A1 * | 10/2009 | Denison | H01L 29/0653 257/408 |
| 2009/0273029 A1 * | 11/2009 | Tien | H01L 29/4236 257/336 |
| 2014/0061791 A1 * | 3/2014 | Yu | H01L 29/404 257/343 |
| 2014/0097492 A1 | 4/2014 | Yu | |

FOREIGN PATENT DOCUMENTS

| JP | 2008-182106 A | 8/2008 |
|---|---|---|
| JP | 2010-258226 | 11/2010 |

OTHER PUBLICATIONS

Hiroki Fujii et al., HCI-induced Off-state I-V Curve Shifting and Subsequent Destruction in an STI-based LD-PMOS Transistor, Proc. of ISPSD'13, pp. 379-382.

Japanese Office Action received in corresponding Japanese Application No. 2014-036944 dated Jun. 20, 2017.

* cited by examiner

SEMICONDUCTOR DEVICE

CROSS-REFERENCE TO RELATED APPLICATIONS

The disclosure of Japanese Patent Application No. 2014-036944 filed on Feb. 27, 2014 including the specification, drawings and abstract is incorporated herein by reference in its entirety.

BACKGROUND

The present invention relates to a semiconductor device. More particularly, the invention relates to the structure of a laterally diffused MOS (metal oxide semiconductor) transistor having a separation insulating film between the gate and the drain.

For element isolation in advanced logic MOS transistors, the STI (shallow trench isolation) structure is often used in place of the LOCOS (local oxidation of silicon) structure so as to reduce the isolation area. Where a high breakdown voltage LDMOS (laterally diffused MOS) transistor is to be formed, the STI structure is known to be used for internal gate-drain isolation in order to ensure breakdown voltage.

Patent Literature 1 (Japanese Unexamined Patent Application Publication No. 2010-258226) states that in the N-channel type LDMOS transistor, the edge of the STI structure is staggered to prevent the fluctuation of on-resistance caused by the concentration of electric fields at the source-side edge of the STI structure.

Patent Literature 2 (U.S. Pat. No. 8,357,986) states that in the LDMOS transistor, the gate electrode is partially embedded in a trench formed over the principal plane of the semiconductor substrate. In this case, the gate electrode is not formed on the drain region side away from the trench so as to reduce the capacitance between the gate electrode and the drain region. Also, for purpose of capacitance reduction, the n type drift region is not formed on the source region side away from the trench. The insulating film isolating the gate electrode in the trench from the substrate making up the side walls and bottom of the trench is approximately as thick as the gate insulating film of the LDMOS transistor because the inside of the substrate in contact with the insulating film serves as the channel region.

Non-Patent Literature 1 states that in the substrate of the P-channel type LDMOS transistor, an electric field is oriented in a direction in which electrons would be injected into the gate oxide film, so that when the electric field is concentrated over the edge of the STI structure, electrons are accelerated and injected into the gate oxide film. It is also stated that the damage caused by the electron injection destroys the gate oxide film at the upper edge of the STI structure.

(Non-Patent Literature 1: Investigation of Multistage Linear Region Drain Current Degradation and Gate-Oxide Breakdown Under Hot-Carrier Stress in BCD HV PMOS, Yu-Hui Huang et al., Proc. of IRPS '11, pp. 444-448)

Non-Patent Literature 2 states that in addition to the above-cited breakdown of the gate oxide film, breakdown voltage drops due to an unbalanced electric field.

(Non-Patent Literature 2: HCl-induced off-state I-V curve shifting and subsequent destruction in an STI-based LD-PMOS transistor, H. Fujii et al., Proc. of ISPSD '13, pp. 379-382)

SUMMARY

One problem with the laterally diffused LDMOS transistor is that under hot carrier stress, on-resistance fluctuates because the electric field is concentrated at the source-side edge of the STI structure generating a high electric field leading to an interface state, or because the electrons produced by impact ionization are injected into the edge of the STI structure.

Another problem is that in the substrate of the P-channel type LDMOS transistor, the electric field is oriented in the direction in which electrons would be injected into the gate oxide film, so that electrons are accelerated at the edge of the STI structure and injected into the gate oxide film generating an unbalanced electric field leading to a decline in breakdown voltage. A further problem, as stated in Non-Patent Literature 1, is that the damage caused by electron injection destroys the gate oxide film at the upper edge of the STI structure.

Whereas Japanese Unexamined Patent Application Publication No. 2010-258226 describes a stagger formed at the bottom edge of the STI structure to suppress electric field concentration, this structure may permit an overall reduction of the electric field in the substrate but will not prevent the drop in breakdown voltage. That is, while electric field concentration in the substrate tends to occur at the bottom edge of the STI structure, the structure of Japanese Unexamined Patent Application Publication No. 2010-258226 forms multiple corners where the electric field concentrates at the edge and also incurs electric field concentration near the stagger formed closer to the gate oxide film. This promotes further injection of electrons into the gate oxide film.

Further objects and advantages of the present invention will become apparent upon a reading of the following description and appended drawings.

Of the embodiments disclosed by this application, one representative embodiment is briefly explained as follows:

According to the present invention, there is provided a semiconductor device in which trenches are formed over the upper surface of an LDMOS transistor separation insulating film, so that gate electrodes are partially embedded in the trenches.

According to one embodiment disclosed by this application, the reliability of the semiconductor device is improved. In particular, the fluctuation of the on-resistance under hot carrier stress is suppressed. It is also possible to prevent fatal phenomena under hot carrier stress such as the decline in breakdown voltage and gate oxide film breakdown.

DETAILED DESCRIPTION

Figure 1:
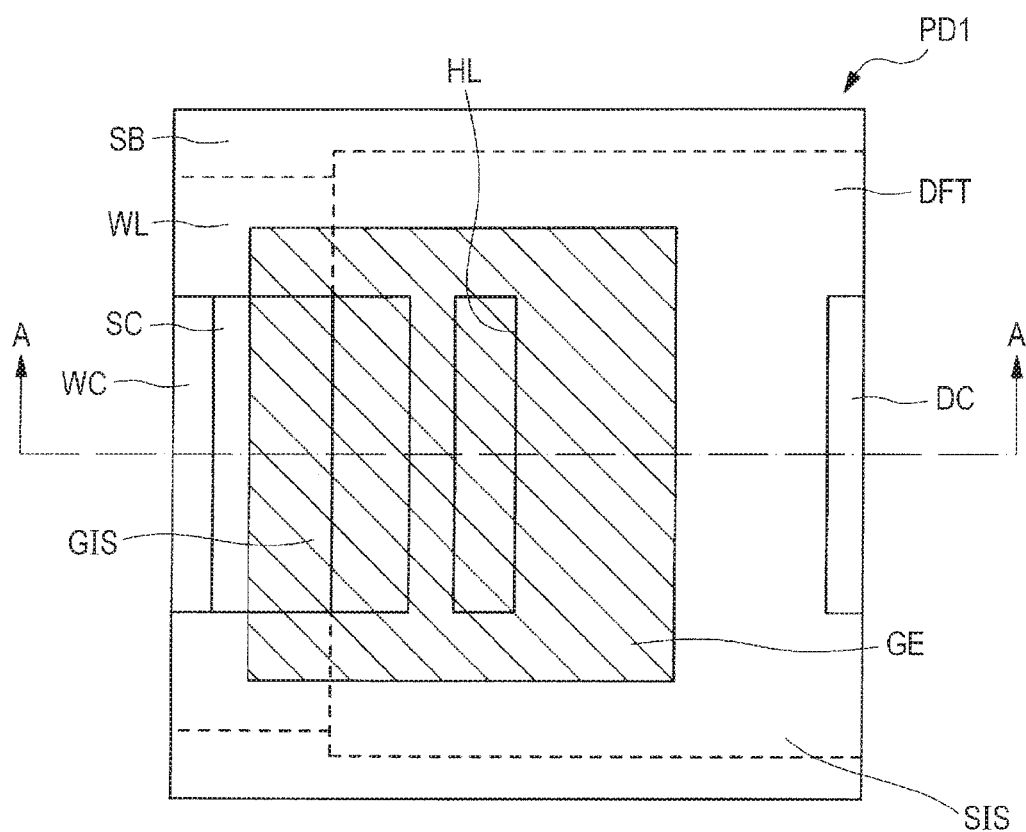
FIG. 1 is a plan view showing a semiconductor device as a first embodiment of the present invention.

The preferred embodiments of the present invention are explained below in detail with reference to the accompanying drawings. Throughout the drawings explanatory of the embodiments, the same reference characters designate the same or functionally equivalent components, and their explanations will not be repeated where redundant. In the description that follows, the explanations of the same or corresponding components of the embodiments will not be repeated in principle unless specifically needed.

In the drawings used hereunder for explaining the embodiments, some portions even in plan views may be partially hatched for ease of viewing.

First Embodiment

Figure 2:
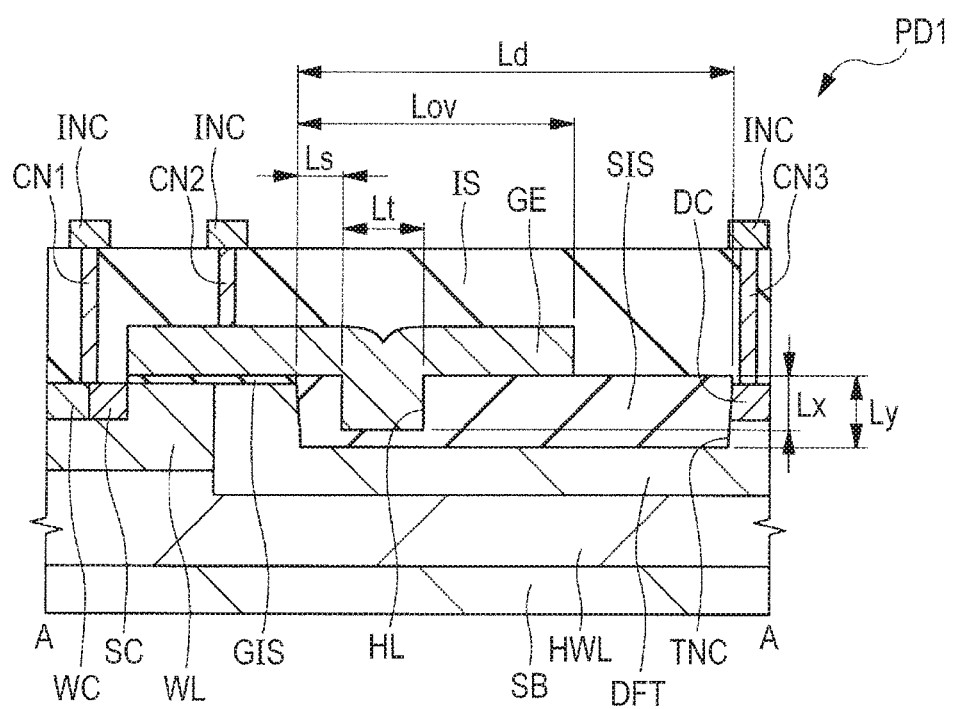
FIG. 2 is a sectional view taken on line A-A in FIG. 2.

Explained below with reference to FIGS. 1 and 2 is the structure of the semiconductor device as the first embodiment of the present invention. FIG. 1 is a plan view showing the structure of an LDMOS transistor as the semiconductor device of the first embodiment. FIG. 2 is a sectional view taken along line A-A in FIG. 2. The LDMOS transistor PD1 shown in FIGS. 1 and 2 is a P-channel type MOS FET (field effect transistor).

FIG. 1 shows a semiconductor substrate SB; a separation insulating film SIS made of an insulating film embedded in an isolation trench formed over the upper surface of the semiconductor substrate SB; and a gate electrode GE formed over the semiconductor substrate SB and separation insulating film SIS. Formed inside the semiconductor substrate SB are a source region (source diffused layer) SC as a $p^+$ type semiconductor region, a drain region (drain diffused layer) DC as a $p^+$ type semiconductor region, a well region WC as an $n^+$ type semiconductor region, a well region WL as an n type semiconductor region, and a drift region DFT as a p type semiconductor region. In FIG. 1, broken lines denote the boundaries separating from one another the semiconductor substrate SB, drift region DFT, and well region WL, all covered with the separation isolating film SIS. In planar view, the region where the gate electrode GE is formed is shown hatched.

As shown in FIG. 1, the upper surfaces of the source region SC, drain region DC and well region WC, of part of the drift region DFT, and of part of the well region WL are exposed from the separation isolating film SIS. A trench HL is formed over the upper surface of the separation isolating film SIS.

As shown in FIG. 2, the P-channel type LDMOS transistor PD1 includes the source region SC, drain region DC, well region WC, well region WL, drift region DFT, a well region HWL as an $n^-$ type semiconductor region, the gate electrode GE, gate insulating film GIS, separation insulating film SIS, and trench HL, all formed in the semiconductor substrate SB. The upper part of the LDMOS transistor PD1 is covered with an interlayer insulating film IS. Contact plugs CN1, CN2 and CN3 passing through the interlayer insulating film IS are coupled to the LDMOS transistor PD1. Also, multiple lines INC formed over the interlayer insulating film IS are coupled to the upper surfaces of the contact plugs CN1, CN2 and CN3.

The semiconductor substrate SB is typically a $p^-$ type silicon substrate. The gate insulating film GIS formed over the semiconductor substrate SB is typically made of a silicon oxide film. The gate electrode GE formed over the semiconductor substrate SB with the gate insulating film GIS interposed therebetween is typically made of polysilicon. Near the upper surface of the semiconductor substrate SB, the well region HWL as an $n^-$ type semiconductor region is formed relatively deep.

Also over the upper surface of the semiconductor substrate SB, the drift region DFT as a $p^+$ type semiconductor region and the well region WL as an n type semiconductor region are formed shallower than the well region HWL. The gate insulating film GIS is formed closer to the source region SC than to a trench TNC and the separation insulating film SIS. That is, in planar view, the gate insulating film GIS and the separation insulating film SIS are arranged adjacent to each other and do not overlap with each another.

The $n^-$ type well region HWL less dense than the n type well region WL is provided all over the LDMOS transistor PD1. The well region WL and the drift region DFT are arranged adjacent to each other, with their boundary coming immediately under the gate electrode GE and gate oxide film. The well region WL is formed shallower than the drift region DFT.

The separation isolating film SIS, primarily made of a silicon oxide film for example, is embedded in the trench TNC formed over the upper surface of the semiconductor substrate SB in a depth shallower than the well region WL and drift region DFT. Over the upper surface of the semiconductor substrate SB, the source region SC and drain region DC are arranged to sandwich the gate electrode GE, gate insulating film GIS and separation insulating film SIS in planar view. The distance between the gate electrode GE and the drain region DC is greater than that between the gate electrode GE and the source region SC. The separation isolating film SIS is interposed between the gate electrode GE and the drain region DC and is located immediately under the gate electrode GE.

The well region WL where the channel of the LDMOS transistor PD1 is formed is shaped to cover the lower surface and side walls of the source region SC. The drift region DFT is formed to cover the lower surface of the drain region DC and the lower surface and side walls of the separation insulating film SIS. One side wall of the well region WC as an $n^+$ type semiconductor region is in contact with the source region SC, and the lower surface of the well region WC is covered with the well region WL. The source region SC, drain region DC, and well region WC are formed over the upper surface of the semiconductor substrate SB in a depth shallower than the well region WL, drift region DFT, and separation insulating film SIS. The drift region DFT is formed immediately under the gate insulating film GIS and also immediately under the separation insulating film SIS. The edge of the drift region DFT on the side of the source region SC is positioned immediately under the gate insulating film GIS.

The gate electrode GE partially covers the separation insulating film SIS formed to ensure desired source-drain breakdown voltage. The field plate effect acquired with this structure provides high breakdown voltage. Increasing the amount of this covering eases the electric field at the edge of the separation insulating film SIS, which in turn suppresses the injection of electrons into the source-side edge of the separation insulating film SIS and the gate insulating film GIS under hot carrier stress. Incidentally, "breakdown voltage" in this application refers to electrical breakdown voltage between the source and the drain unless otherwise specified. The breakdown voltage in effect when the gate is turned off is called off-breakdown voltage, and the breakdown voltage in effect when the gate is on is called on-breakdown voltage.

The contact plug CN1 is electrically coupled to the upper surfaces of the well region WC and source region SC with a sillicide layer (not shown) interposed therebetween. That is, the well region WC and the source region SC are short-circuited via the sillicide layer (not shown) formed over their upper surfaces. The short-circuiting between the well region WC and the source region SC is intended to suppress the base resistance of a parasitic bipolar transistor in the semiconductor substrate. Short-circuiting the well region WC and the source region SC prevents the parasitic bipolar transistor from being turned on. In this context, the parasitic bipolar transistor can be formed by a PNP junction made up of the source region SC, well region WL, and drift region DFT for example.

The contact plug CN2 is electrically coupled to the upper surface of the gate electrode GE via the sillicide layer (not shown). The contact plug CN3 is electrically coupled to the upper surface of the drain region DC via the sillicide layer (not shown).

In the manner described above, the source region SC and the drain region DC are formed in pairs over the principal plane of the semiconductor substrate SB. The separation insulating film SIS is formed in the trench TNC between the source region SC and the drain region DC. The gate insulating film GIS is formed closer to the source region SC than to the separation insulating film SIS. Between the source region SC and the drain region DC, the gate electrode GE is formed in a manner extending over the gate insulating film GIS and separation insulating film SIS. That is, the gate electrode GE is formed in a manner extending immediately above the gate insulating film GIS and separation insulating film SIS.

Figure 37:
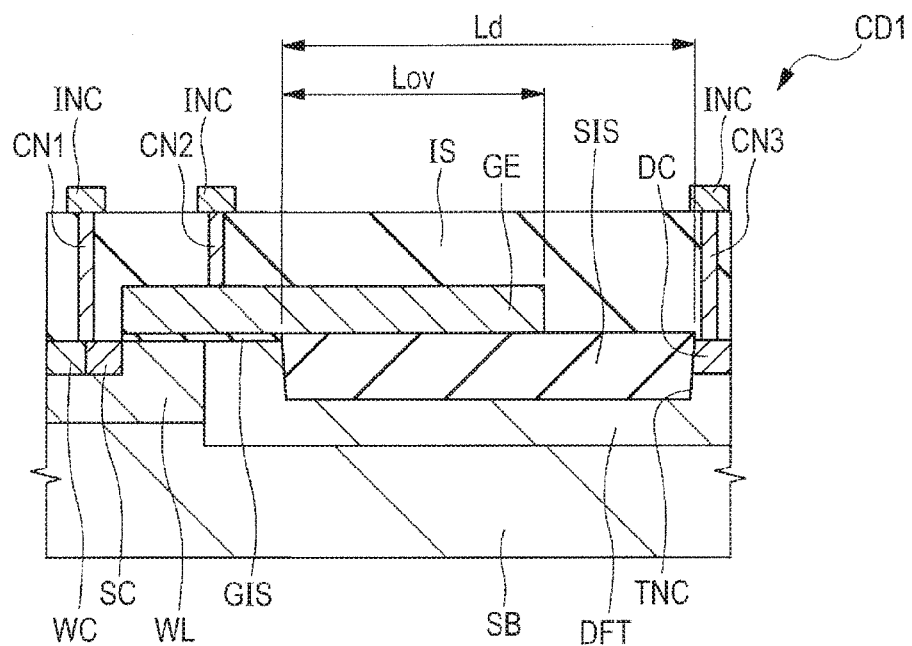
FIG. 37 is a sectional view showing an N-channel type LDMOS transistor as a semiconductor device of the first comparative example.

The gate electrode GE is embedded in the trench HL formed over the upper surface of the separation insulating film SIS. Here, if the trench HL is not formed over the upper surface of the separation insulating film SIS as in the case of a P-channel type LDMOS transistor as the semiconductor device of the first comparative example shown in FIG. 38, the following problems are experienced: the off-breakdown voltage drops due to a reinforced electric field over the surface of the semiconductor substrate SB under the edge of the gate electrode GE. Also, over the surface of the semiconductor substrate SB under the edge of the gate electrode GE, electrons are increased by impact ionization and the resulting electron current turns on the parasitic bipolar transistor, thereby causing the on-breakdown voltage to drop. This also applies, as shown in FIG. 37, to an N-channel type LDMOS transistor CD1 having no trench HL. FIG. 37 is a sectional view showing the N-channel type LDMOS transistor that is a semiconductor device of the first comparative example.

Another problem with each of the N-channel and P-channel type LDMOS transistors is that under hot carrier stress, electric field concentration causing a high electric field at the source-side edge of the STI structure incurs an interface state and that the electrons generated by impact ionization are injected into the edge of the STI structure causing the on-resistance to fluctuate. A further problem with the P-channel type LDMOS transistor is that because the electric field is oriented in the direction in which electrons would be injected into the gate insulating film, electrons are accelerated at the edge of the STI structure and injected into the gate insulating film, causing the unbalanced electric field to lower breakdown voltage. Another problem is that the damage caused by such electron injection destroys the gate oxide film at the upper edge of the STI structure.

Figure 39:
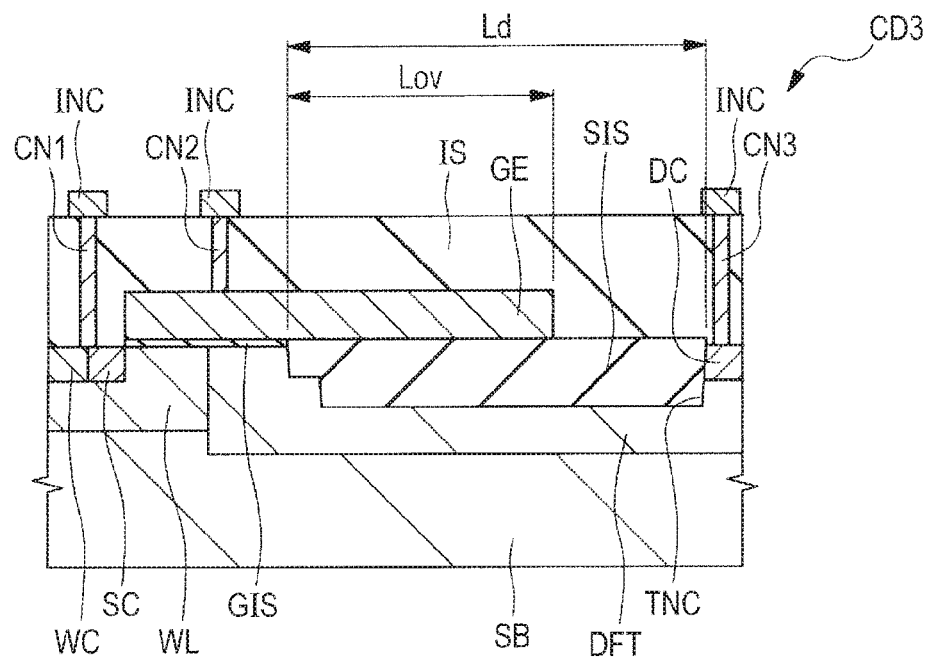
FIG. 39 is a sectional view showing an N-channel type LDMOS transistor as a semiconductor device of a second comparative example.
Figure 40:
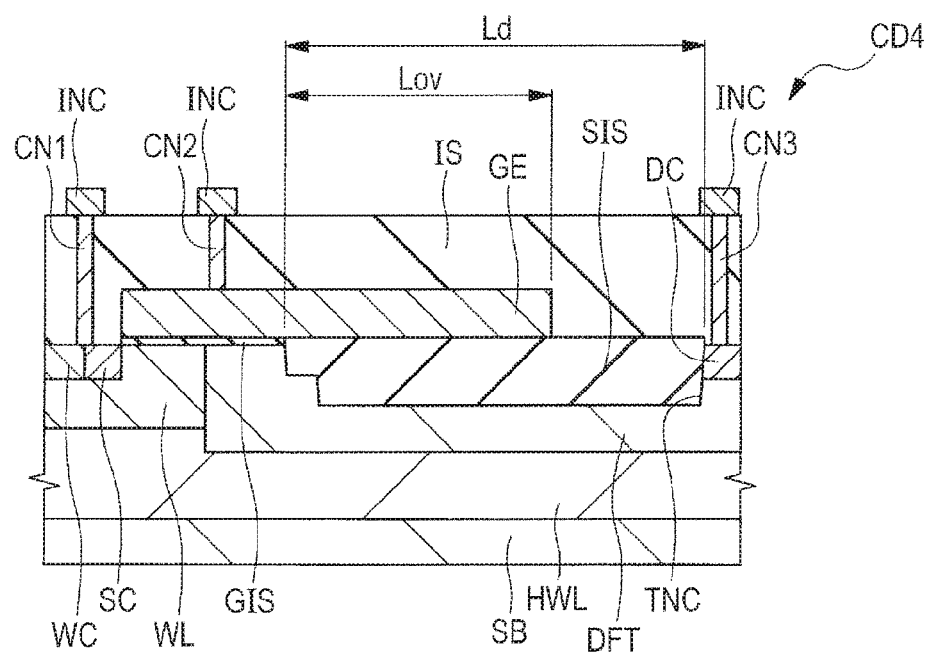
FIG. 40 is a sectional view showing a P-channel type LDMOS transistor as another semiconductor device of the second comparative example.

By contrast, as in LDMOS transistors CD3 and CD4 shown respectively in FIGS. 39 and 40 as the second comparative example, the electric field at the edge of the STI structure where electric field concentration is the highest may conceivably be eased by staggering the edge of the STI structure (i.e., the separation insulating film SIS). FIG. 39 is a sectional view of an N-channel type LDMOS transistor C as a semiconductor device of the second comparative example. FIG. 40 is a sectional view of a P-channel type LDMOS transistor CD4 as another semiconductor device of the second comparative example.

Unlike the LDMOS transistor PD1 of the first embodiment (see FIG. 2), the LDMOS transistors CD3 and CD4 of the second comparative example shown in FIGS. 39 and 40 do not have the trench HL. At the bottom of the separation insulating film SIS, the edge on the side of the source region SC is staggered.

The N-channel type LDMOS transistors shown in FIGS. 37 and 39 are different from the P-channel type LDMOS transistors indicated in FIGS. 38 and 40 in the following respects: unlike the P-channel type LDMOS transistor, the N-channel type LDMOS transistor does not have the well region HWL, and the conductivity types of the source region SC, drain region DC, drift region DFT, well region WL, and well region WC in the N-channel type LDMOS transistor are opposite to those in the P-channel type LDMOS transistor. That is, in the N-channel type LDMOS transistor CD3, the source region SC and drain region DC are of $n^+$ type, the drift region DFT is of n type, the well region WL is of p type, and the well region WC is of $p^+$ type.

Incidentally, the structure of an N-channel type LDMOS transistor PD4 to be discussed later as the fourth embodiment (see FIG. 33) is also different from the structure of the P-channel type LDMOS transistor PD1 of the first embodiment (see FIG. 2) as discussed above.

Figure 41:
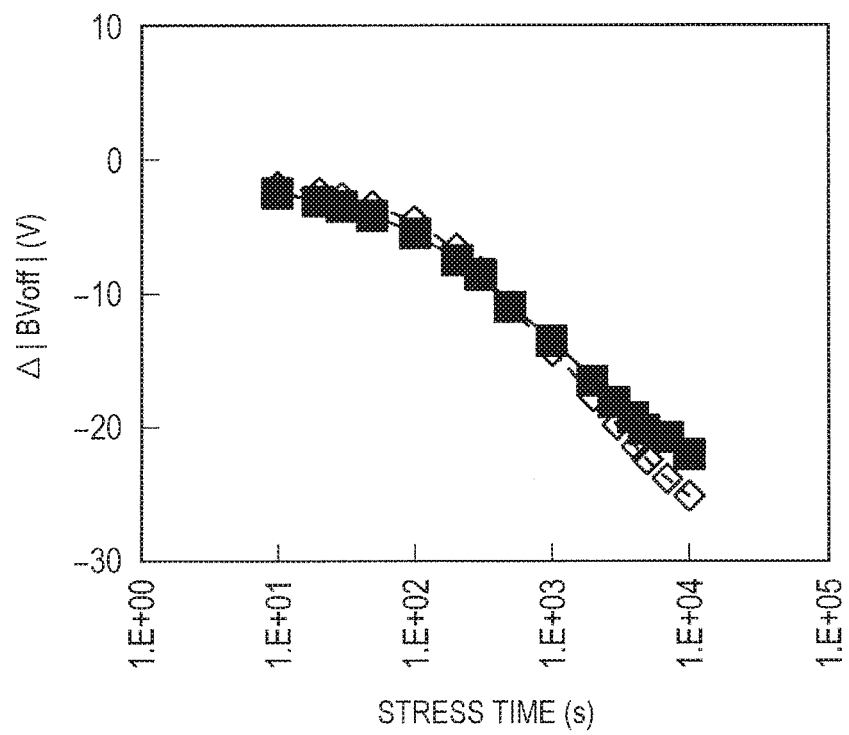
FIG. 41 is a graphic representation showing relations between the elapse of time during which the semiconductor devices of the first and the second comparative examples are subjected to stress on the one hand, and their off-breakdown voltage on the other hand.

FIG. 41 shows observation results of changes in the breakdown voltage of LDMOS transistors CD2 (see FIG. 38) and CD4 (see FIG. 40) under hot carrier stress. FIG. 41 is a graphic representation showing relations between the elapse of time during which the semiconductor devices of the first and the second comparative examples are subjected to stress on the one hand, and their off-breakdown voltage BVoff on the other hand. The observation results of the LDMOS transistor CD2 are plotted by broken lines and hollow lozenges, and the observation results of the LDMOS transistor CD4 are plotted by solid lines and solid rectangles. That is, FIG. 41 compares the LDMOS transistor CD2 of the first comparative example in which the STI structure is not staggered, with the LDMOS transistor CD4 of the second comparative example in which the STI structure is staggered, in terms of breakdown voltage survival rate.

Figure 38:
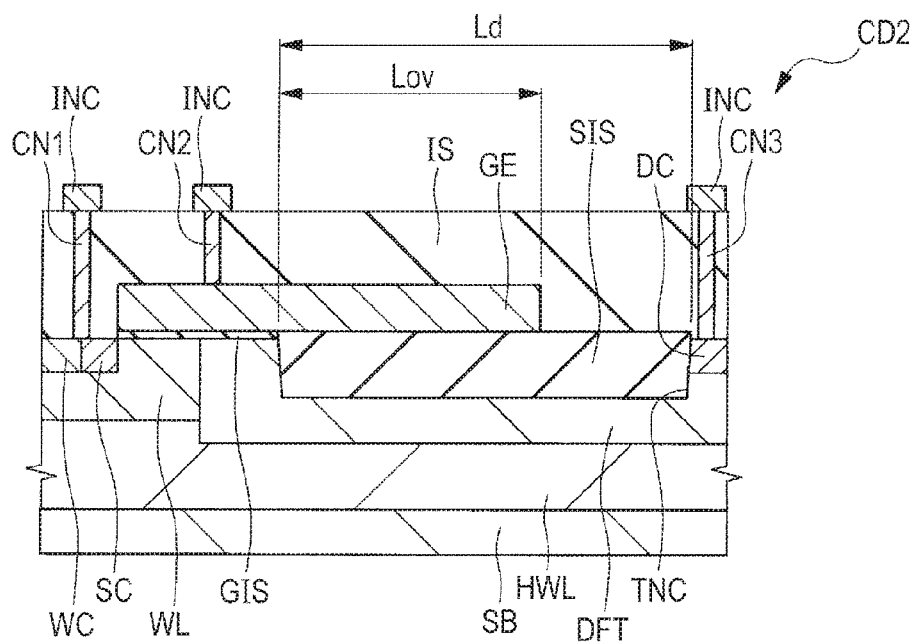
FIG. 38 is a sectional view showing a P-channel type LDMOS transistor as another semiconductor device of the first comparative example.

From the graphic representation in FIG. 41, it can be seen that even in the staggered structure shown in FIG. 40, a drop in breakdown voltage also occurs as in the case of the non-staggered structure in FIG. 38 under hot carrier stress. Apparently, this is the result of two corners occurring at the source-side edge of the STI structure where the electric field is concentrated, which has promoted injection of electrons into the edge of the STI structure. A gate current Ig representative of the amount of injected electrons has increased as indicated by the observation results in FIG. 42.

Figure 42:
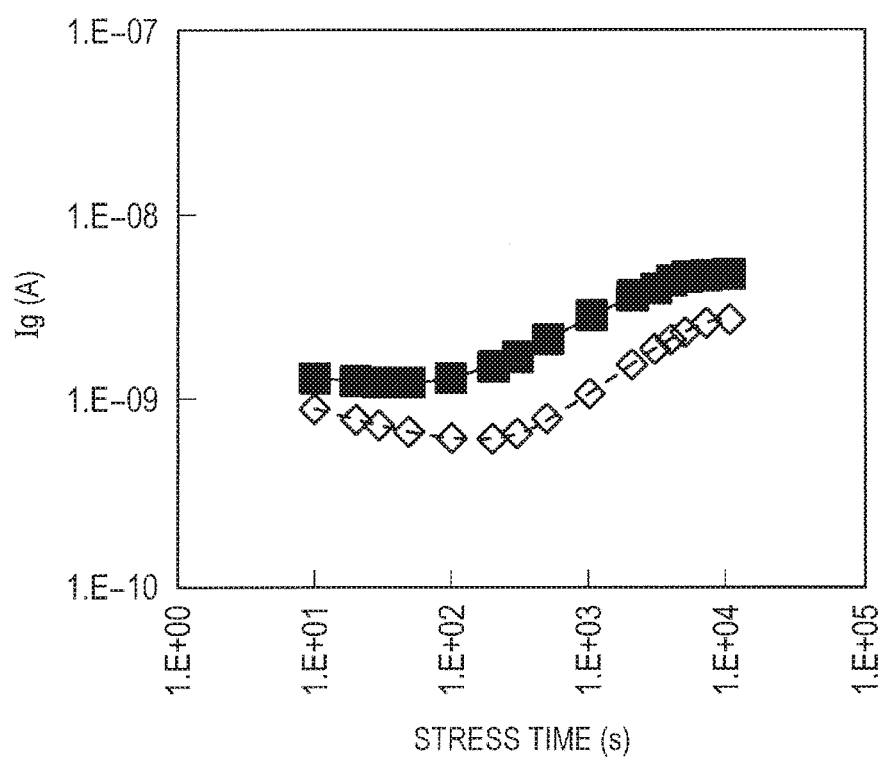
FIG. 42 is a graphic representation showing relations between the elapse of time during which the semiconductor devices of the first and the second comparative examples are subjected to stress on the one hand, and their gate current on the other hand.
Figure 43:
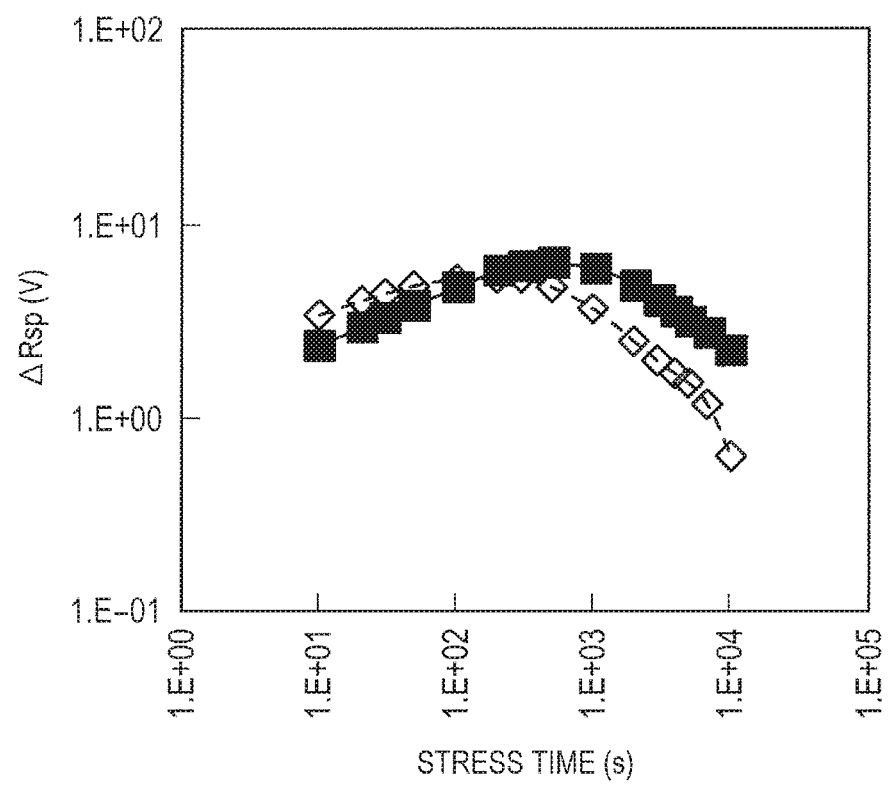
FIG. 43 is a graphic representation showing relations between the elapse of time during which the semiconductor devices of the first and the second comparative examples are subjected to stress on the one hand, and their on-resistance on the other hand.

Consequently, as indicated by the observation results in FIG. 43, the above-described staggered structure fails to reduce the amount of changes in on-resistance Rsp. Whereas the P-channel type LDMOS transistor has various problems stemming from the positive injection of electrons under hot carrier stress into the STI structure or the gate oxide film, it is difficult for the structure shown in FIG. 40 to solve these problems as indicated by the observation results in FIGS. 41 through 43. Although the N-channel type LDMOS transistor (see FIGS. 37 through 39), unlike the P-channel type, is not very likely to encounter the problems of electrons being injected into the gate insulating film and of the gate insulating film getting destroyed, it is still difficult for the staggered STI structure to resolve the problem of electrons being injected into the STI structure under hot carrier stress leading to a decline in the breakdown voltage of the device, as explained above with reference to FIGS. 41 through 43.

Incidentally, "gate current" mentioned in this application refers to the current that flows between the semiconductor substrate and the gate electrode with the gate insulating film or separation insulating film interposed therebetween. FIG. 42 is a graphic representation showing relations between the elapse of time during which the semiconductor devices of the first and the second comparative examples are subjected to stress on the one hand, and their gate current Ig on the other hand. FIG. 43 is a graphic representation showing relations between the elapse of time during which the semiconductor devices of the first and the second comparative examples are subjected to stress on the one hand, and their on-resistance Rsp on the other hand. In FIGS. 42 and 43, as in FIG. 41, the observation results of the LDMOS transistor CD2 are plotted by broken lines and hollow lozenges, and the observation results of the LDMOS transistor CD4 are plotted using solid lines and solid rectangles.

In order to address the above problems, the first embodiment has the trench HL formed over the upper surface of the separation insulating film SIS in FIG. 2 in a region close to the gate insulating film SIS and the source region SC, with the gate electrode GE partially embedded in the trench HL. Here, there is no need to make the amount of covering of the gate electrode GE over the separation insulating film SIS longer than is necessary because the gate electrode GE embedded in the trench HL eases the electric field in the semiconductor substrate SB near the source-side edge of the separation isolating film SIS. This makes it possible to improve hot carrier characteristics while preventing drops in off-breakdown voltage and on-breakdown voltage resulting from the length Lov as the amount of covering of the gate electrode GE getting longer. That in turn prevents fluctuations in the breakdown voltage of the LDMOS transistor and enhances the reliability of the gate insulating film, so that the reliability of the semiconductor device is improved.

According to the first embodiment, embedding the gate electrode GE in part of the separation insulating film SIS eases the electric field near the edge of the separation insulating film SIS where electric field concentration is the highest. This suppresses the injection of electrons under hot carrier stress into the edge of the separation insulating film SIS or into the gate insulating film GIS, reduces the fluctuations of on-resistance, and prevents the breakdown of the gate insulating film GIS.

A method for manufacturing the semiconductor device of the first embodiment is explained below with reference to FIGS. 3 through 8. FIGS. 3 through 8 are sectional views indicative of the method for manufacturing the LDMOS transistor as the semiconductor device of the first embodiment shown in FIGS. 1 and 2.

Figure 3:
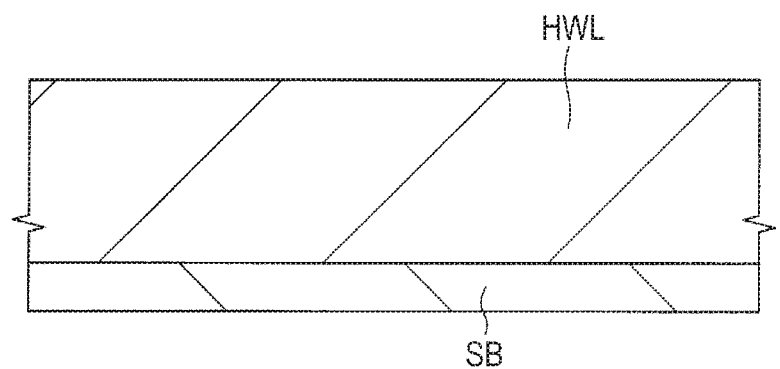
FIG. 3 is a sectional view explaining how the semiconductor device of the first embodiment is manufactured.

First, as shown in FIG. 3, a p⁻ type silicon semiconductor substrate SB is prepared. Next, well-known lithography technology is used to form a photoresist film in a manner leaving those regions opened where LDMOS transistors are to be formed, followed by injection of n type impurities into the upper surface of the semiconductor substrate SB. After removal of the photoresist film, heat treatment at temperatures exceeding 1000° C. is performed to diffuse the n type impurities from the upper surface of the semiconductor substrate SB into deeper regions, thereby forming an n⁻ type well region HWL.

Figure 4:
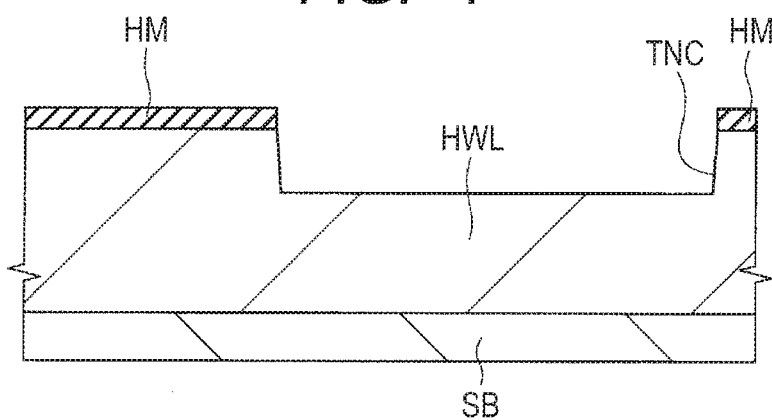
FIG. 4 is a sectional view continued from FIG. 3 and explaining how the semiconductor device is manufactured.

Then as shown in FIG. 4, a hard mask HM for forming the STI structure is deposited on the surface of the semiconductor substrate SB. The hard mask HM is made of a silicon nitride film for example, or is formed by layers of a silicon oxide film and a silicon nitride film. Next, a photolithographic technique is used to form a photoresist film in a manner leaving open those regions where an STI structure is to be formed. Thereafter, anisotropic etching is performed to remove by a depth of several hundreds of nm the semiconductor substrate SB exposed from the openings in the photoresist film, followed by removal of the photoresist film.

Figure 5:
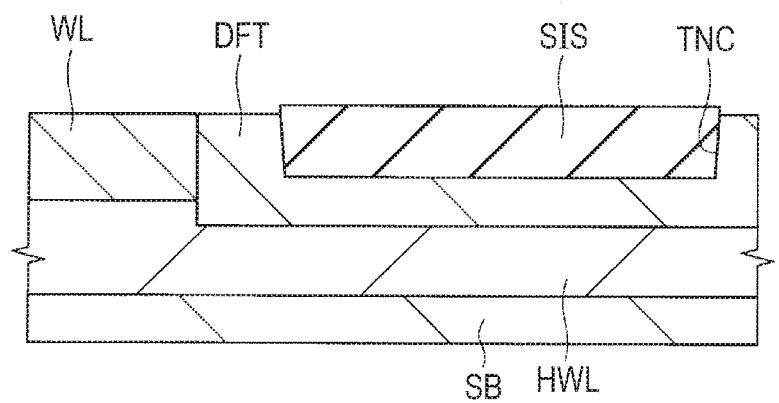
FIG. 5 is a sectional view continued from FIG. 4 and explaining how the semiconductor device is manufactured.

Next, as shown in FIG. 5, a silicon oxide film is deposited all over the semiconductor substrate SB to fill out the trench TNC. After this, the CMP (chemical mechanical polishing) method or etch-back method is used to remove the silicon oxide film from above the hard mask HM, leaving only inside the trench TNC the separation isolating film SIS made of the silicon oxide film. Thereafter, the hard mask HM is removed using isotropic etching or some other suitable technique. Next, the photolithographic technique is used to form, over the upper surface of the semiconductor substrate SB, a p type drift region DFT and an n type well region WL successively through ion injection or some other suitable measures. The p type drift region DFT may precede the n type well region WL when formed or vice versa.

Figure 6:
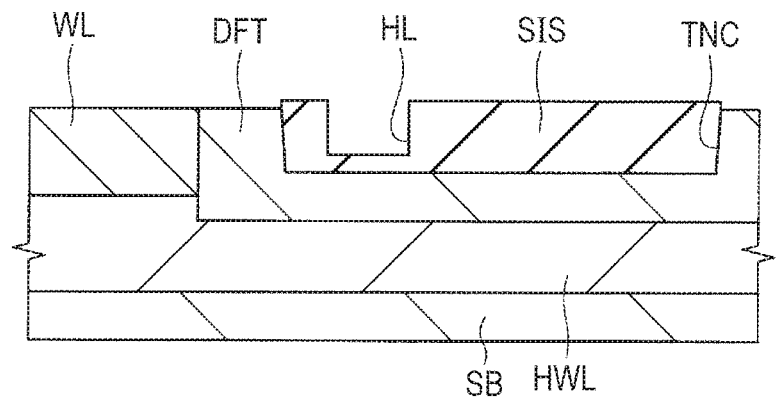
FIG. 6 is a sectional view continued from FIG. 5 and explaining how the semiconductor device is manufactured.

Then as shown in FIG. 6, the photolithographic technique is used to form a photoresist film (not shown) opened so as to expose the portion where a trench HL is to be formed over the upper surface of the separation isolating film SIS in the trench TNC. The opening of the photoresist film is positioned immediately above the separation isolating film SIS, away from the edge of the separation isolating film SIS, and in a region overlapping in planar view with the region where the gate electrode GE (see FIG. 7) is scheduled to be formed in a subsequent process. Next, anisotropic etching is performed using this photoresist film for example as the mask to form the trench HL over the upper surface of the separation isolating film SIS. The trench HL is formed to at least a third of the depth of the separation isolating film SIS but not so deep as to reach the bottom thereof. Thereafter, the photoresist film is removed.

Figure 7:
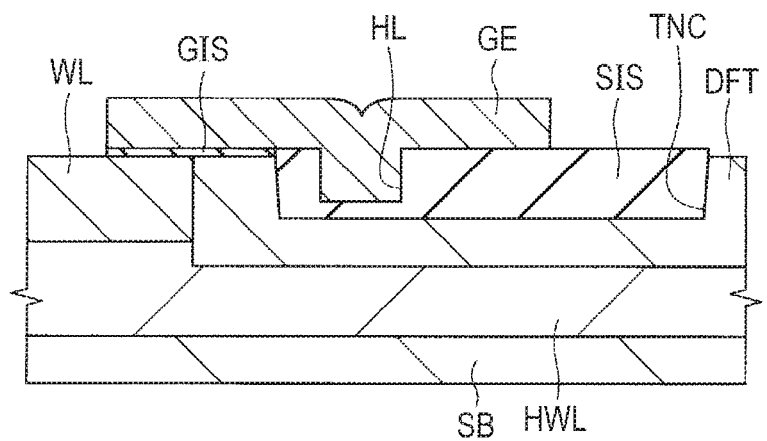
FIG. 7 is a sectional view continued from FIG. 6 and explaining how the semiconductor device is manufactured.

Next, as shown in FIG. 7, the thermal oxidation method or the like is used to form a gate insulating film GIS to a thickness of several to tens of nm. Over the gate insulating film GIS, a polysilicon layer that will make up a gate electrode GE is formed using CVD (chemical vapor deposition) or some other suitable method. The photolithographic technique is then used to form a photoresist film pattern covering only the region where the gate electrode GE is scheduled to be formed. At this point, the trench HL is covered with the photoresist film. After this, anisotropic etching is performed to remove the polysilicon in a manner exposing the upper surfaces of the semiconductor substrate SB and separation isolating film SIS to form the gate electrode GE, followed by removal of the photoresist film.

Figure 8:
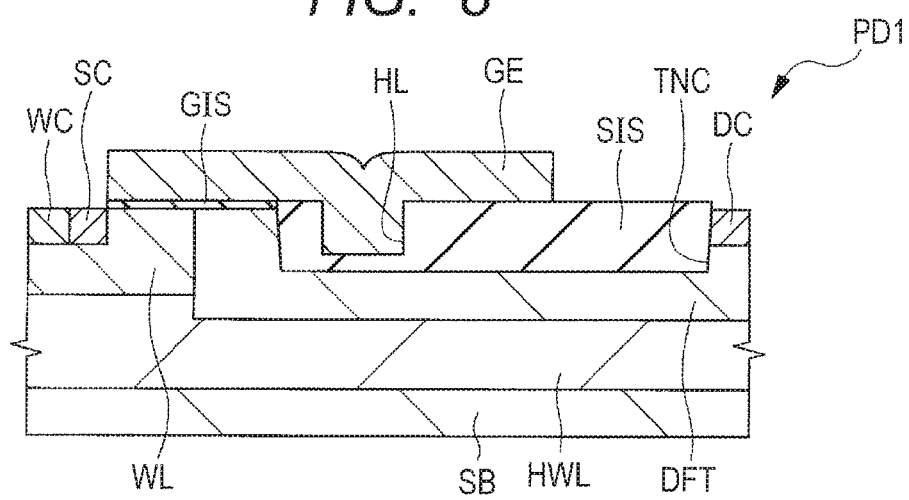
FIG. 8 is a sectional view continued from FIG. 7 and explaining how the semiconductor device is manufactured.

Then as shown in FIG. 8, the photolithographic technique is used to form successively the drain region DC, source region SC, and well region WC through ion injection or some other suitable measures. In this manner, the LDMOS transistor PD1 is formed to have the source region SC, drain region DC, well region WC, well region WL, drift region DFT, well region HWL, gate electrode GE, gate insulating film GIS, separation insulating film SIS, and trench HL.

Next, an interlayer insulating film IS is deposited all over the semiconductor substrate SB using the CVD method for example. After this, the photolithographic technique is used to form multiple connection holes in the interlayer insulating film IS. These connection holes are filled with a conductor such as tungsten to form contact plugs CN1 through CN3. A necessary number of wiring layers are then formed over the interlayer insulating film IS. The lines INC coupled to the LDMOS transistor make up the wiring layers. The principal material of the wiring is Al (aluminum) or Cu (copper) for example. The structure shown in FIGS. 1 and 2 is produced in the manner described above. Although not shown, electrode pads are formed over the uppermost wiring layer.

Explained below are the effects of the semiconductor device as the first embodiment. While one object of the first embodiment is to suppress fluctuations of on-resistance under hot carrier stress and to prevent breakdown of the gate oxide film, an effective indicator indicating whether the object is attained is the gate current Ig reflecting the amount of injected electrons under stress. What follows is a detailed explanation of how the gate electrode GE (see FIG. 2) inside the trench HL (FIG. 2) characteristic of the structure of the first embodiment is effective in lowering the gate current Ig.

Figure 44:
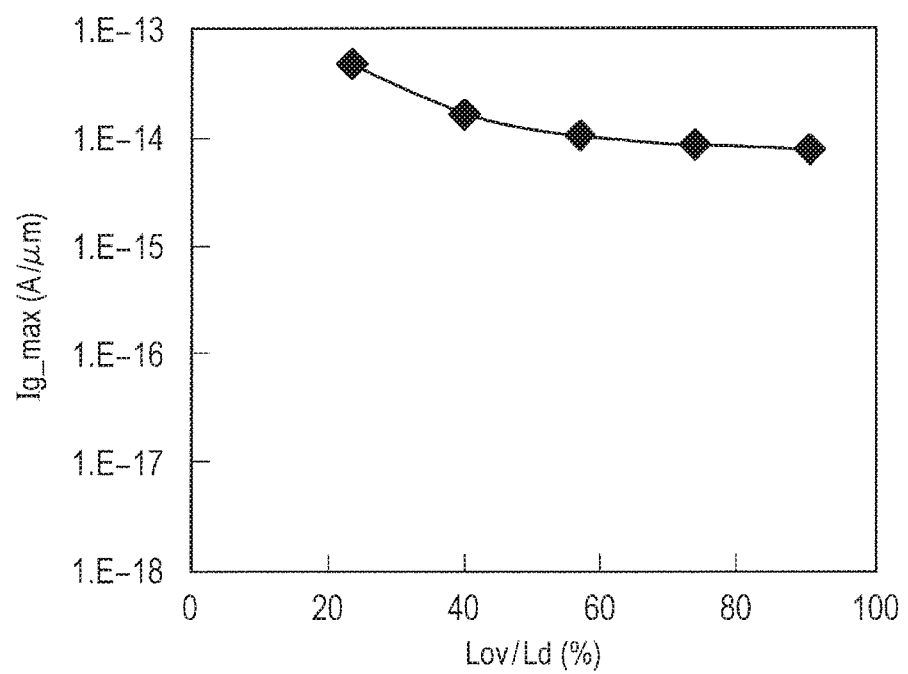
FIG. 44 is a graphic representation showing changes in the gate current of the semiconductor device as the first comparative example with regard to the amount of covering of the gate electrode therein.

Explained first is the gate current Ig of the LDMOS transistor CD2 (see FIG. 38) structured not to have the trench HL. This gate current Ig can be lowered by reducing the electric field near the edge of the separation insulating film SIS. An effective technique for lowering the gate current Ig in the LDMOS transistor CD2 involves increasing the length Lov as the amount of covering of the gate electrode GE with regard to the separation isolating film SIS. FIG. 44 is a graphic representation of device simulation results showing changes in the gate current Ig with regard to the length Lov in the LDMOS transistor CD2.

Here, the length Lov is given as the length of the drift region DFT immediately under the separation insulating film SIS, i.e., as the ratio (in percentage) with regard to the length Ld of the drain region immediately under the separation insulating film SIS. The length Ld of the p type drift region DFT is constant. When the length Lov as the amount of covering of the gate electrode GE increases, the electric field at the source-side edge of the separation insulating film SIS is eased, so that the gate current Ig is lowered. However, as shown in FIG. 45, there occurs the problem of the off-breakdown voltage BVoff and on-breakdown voltage BVon getting dropped.

Figure 45:
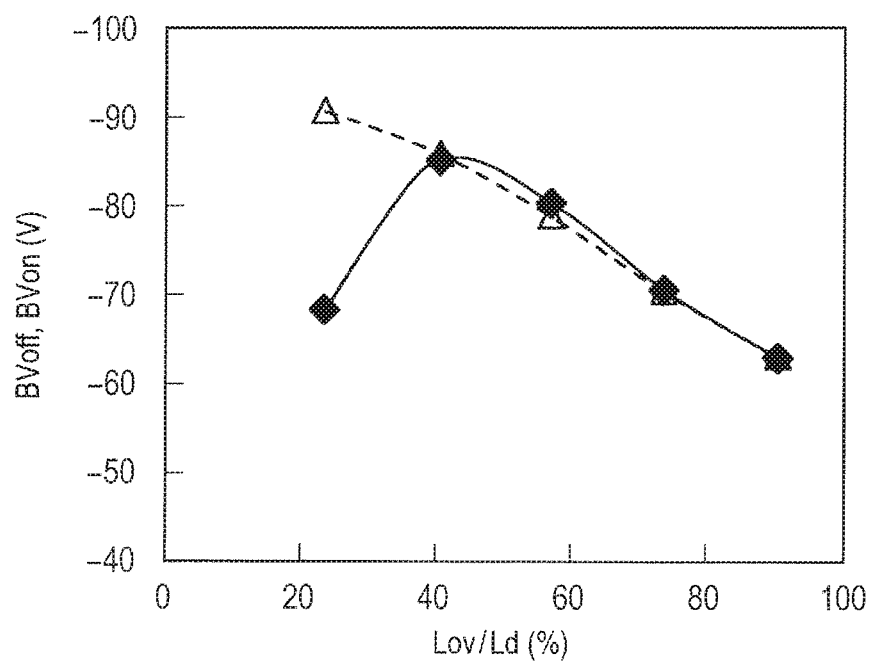
FIG. 45 is a graphic representation showing changes in the off-breakdown voltage and on-breakdown voltage of the semiconductor device as the first comparative example with regard to the amount of covering of the gate electrode therein.

FIG. 45 is a graphic representation showing changes in the off-breakdown voltage BVoff and on-breakdown voltage BVon with regard to the length Lov in the LDMOS transistor CD2. In FIG. 45, the graph of the off-breakdown voltage BVoff is plotted by solid lines and solid lozenges, and the graph of the on-breakdown voltage BVon is plotted by broken lines and hollow triangles.

Explained below is the structure of the first embodiment, with emphasis on how the gate current Ig is affected by the planar position of the gate electrode GE in the trench HL shown in FIG. 2. Layout parameters indicative of the planar position of the gate electrode GE inside the trench HL include the width Lt of the trench HL, the distance Ls between the source-side edge of the separation insulating film SIS and the trench HL, and the length Lov as the amount of covering of the gate electrode GE with regard to the separation insulating film SIS. The width Lt, distance Ls, and length Lov are each a distance along the direction in which the source region and drain region making up the LDMOS transistor are arranged, i.e., in the direction along the principal plane of the semiconductor substrate.

And as shown in FIG. 2, reference character Ly represents the thickness of the separation insulating film SIS in a direction perpendicular to the principal plane of the semiconductor substrate SB, and reference character Lx denotes the depth of the trench HL in the same direction. That is, the depth Lx of the trench HL is the distance from the upper surface of the separation insulating film SIS to the bottom of the trench HL.

What follows is an explanation of the changes in the gate current Ig in effect when the above-mentioned parameters are each varied, with some references to device simulation results.

Figure 9:
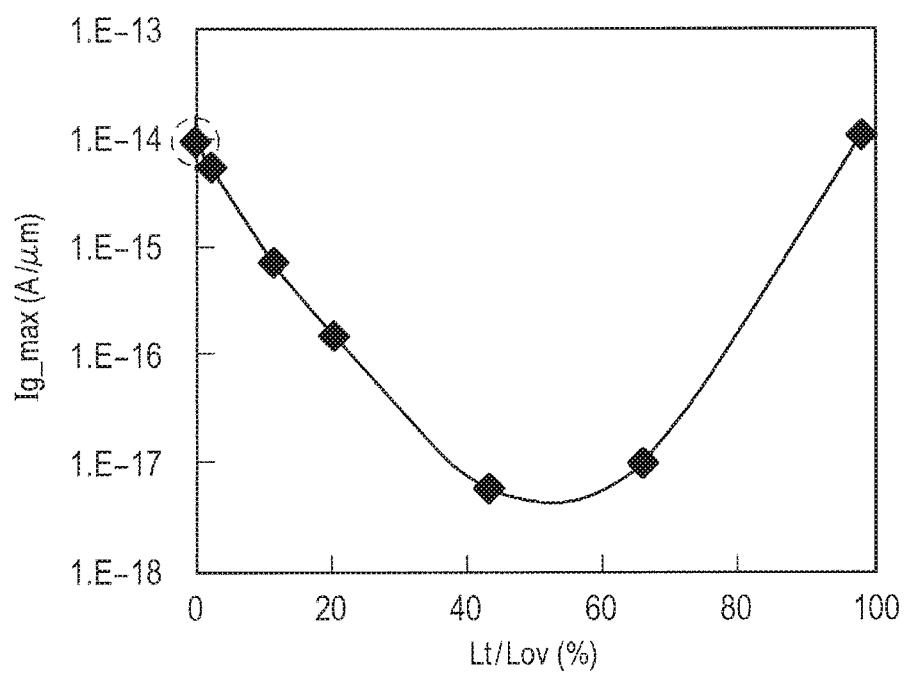
FIG. 9 is a graphic representation showing how the gate current varies with the trench width in an LDMOS transistor of the first embodiment.

FIG. 9 is a graphic representation of device simulation results showing how the gate current Ig varies depending on the width Lt of the trench HL in the LDMOS transistor PD1 of the first embodiment shown in FIG. 2. Here, the width Lt of the trench HL is given as the ratio (in percentage) to the length Lov as the amount of covering of the gate electrode GE with regard to the separation insulating film SIS. The value of the length Lov is constant. In this simulation, the distance ratio Ls/Lov is fixed to 6.8% and the depth ratio Lx/Ly is fixed to 77%. Where the trench HL is not formed as in the LDMOS transistor CD2 (see FIG. 38) of the first comparative example, i.e., where the width Lt of the trench HL is fixed to 0%, the gate current Ig takes the value indicated by a broken-line circle in FIG. 9.

As shown in FIG. 9, when the width Lt of the trench HL is increased from 0% to about 50%, the gate current Ig is progressively lowered. With the width Lt at about 50%, the gate current Ig is minimized. Thus as compared with the LDMOS transistor CD2 (see FIG. 38) of the first comparative example in which the trench HL is not formed, the LDMOS transistor PD1 (see FIG. 2) of the first embodiment can lower the gate current Ig by about three orders of magnitude.

Figure 10:
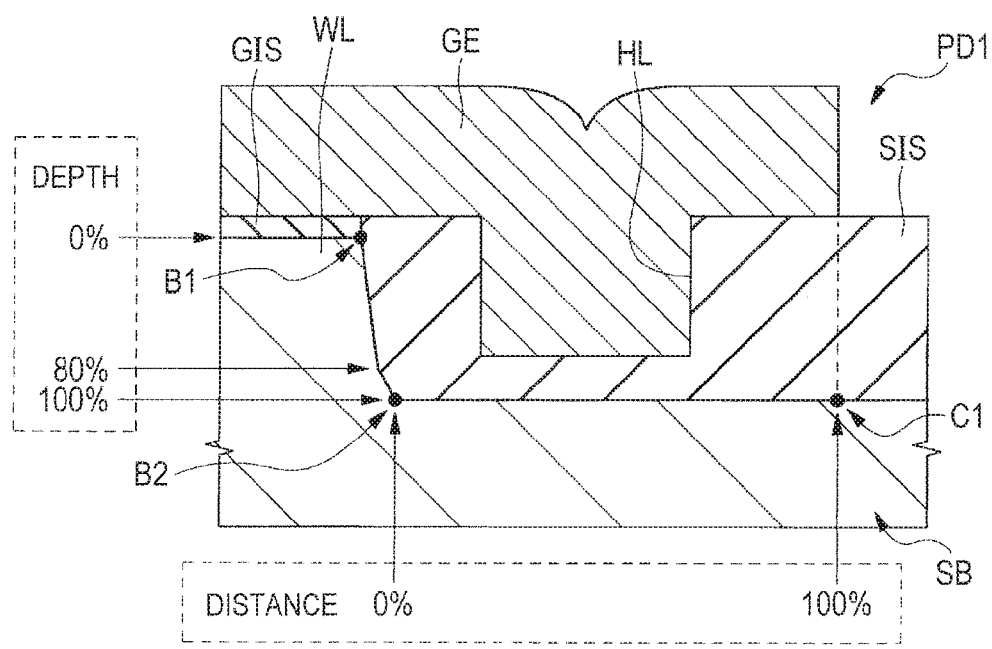
FIG. 10 is an enlarged sectional view showing a portion in FIG. 2.

Here, FIG. 10 is an enlarged sectional view showing a source-region-side edge of the separation insulating film in the semiconductor device of the first embodiment. In FIG. 10, specific points B1, B2 and C1 are shown on the boundary between the separation insulating film SIS and the semiconductor substrate SB. The point B1 represents an upper edge of the boundary between the separation insulating film SIS and the semiconductor substrate SB. The point B2 denotes a source-region-side edge of the separation insulating film SIS at its bottom. The point C1 stands for the boundary between the separation insulating film SIS and the semiconductor substrate SB immediately under a drain-region-side edge of the gate electrode GE.

Figure 11:
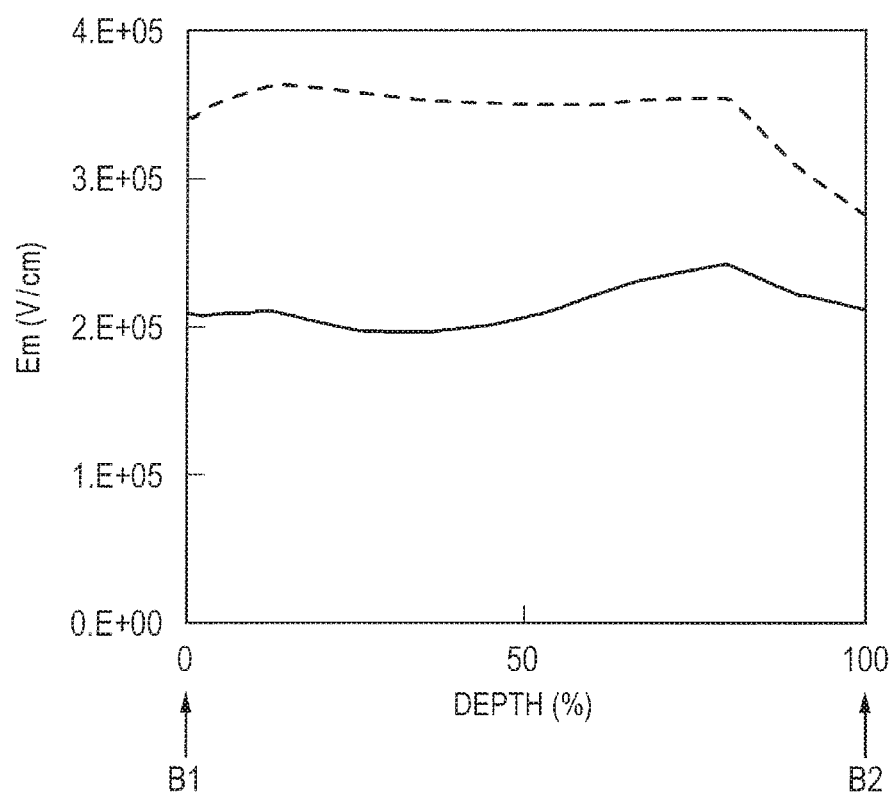
FIG. 11 is a graphic representation showing an electric field on the side of the semiconductor substrate along the source-side edge of the separation insulating film.
Figure 12:
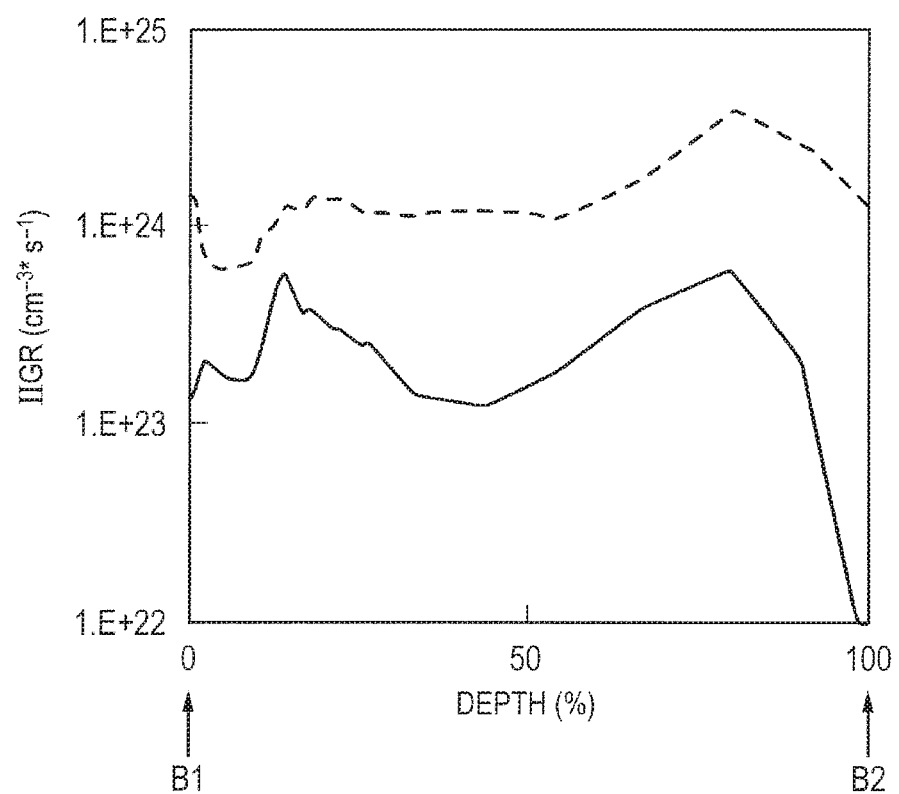
FIG. 12 is a graphic representation showing an impact ionization generation rate on the side of the semiconductor substrate along the source-side edge of the separation insulating film.

FIG. 11 is a graphic representation of simulation results showing the electric field on the side of the semiconductor substrate SB on a boundary line B1-B2 in the sectional view of FIG. 10 along the source-side edge of the separation insulating film SIS. FIG. 12 is a graphic representation of simulation results showing an impact ionization generation rate (IIGR) on the side of the semiconductor substrate SB on the boundary line B1-B2. As indicated by these results, the gate electrode GE inside the trench HL shown in FIG. 10 eases the electric field at the source-side edge of the separation insulating film SIS and thereby suppresses the amount of impact ionization. With the impact ionization generation rate thus lowered, the injection of electrons into the separation insulating film SIS or into the gate insulating film GIS can be reduced.

In FIGS. 11 and 12, the results about the LDMOS transistor PD1 of the first embodiment are plotted by solid lines and the results regarding the LDMOS transistor CD2 (see FIG. 38) of the first comparative example are plotted by broken lines. Here, in the graphs of the first embodiment plotted by solid lines, the distance ratio Lt/Lov is 43%. In the graphs of the first comparative example plotted by broken lines, the width Lt is 0.

Figure 13:
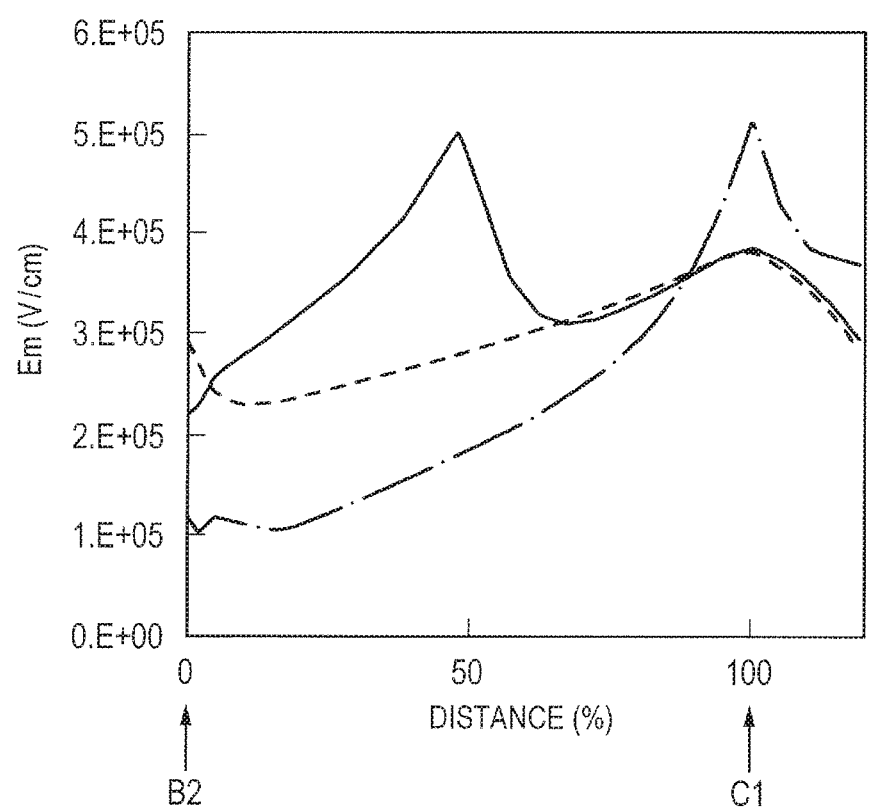
FIG. 13 is a graphic representation showing an electric field on the side of the semiconductor substrate at the bottom of the separation insulating film.
Figure 14:
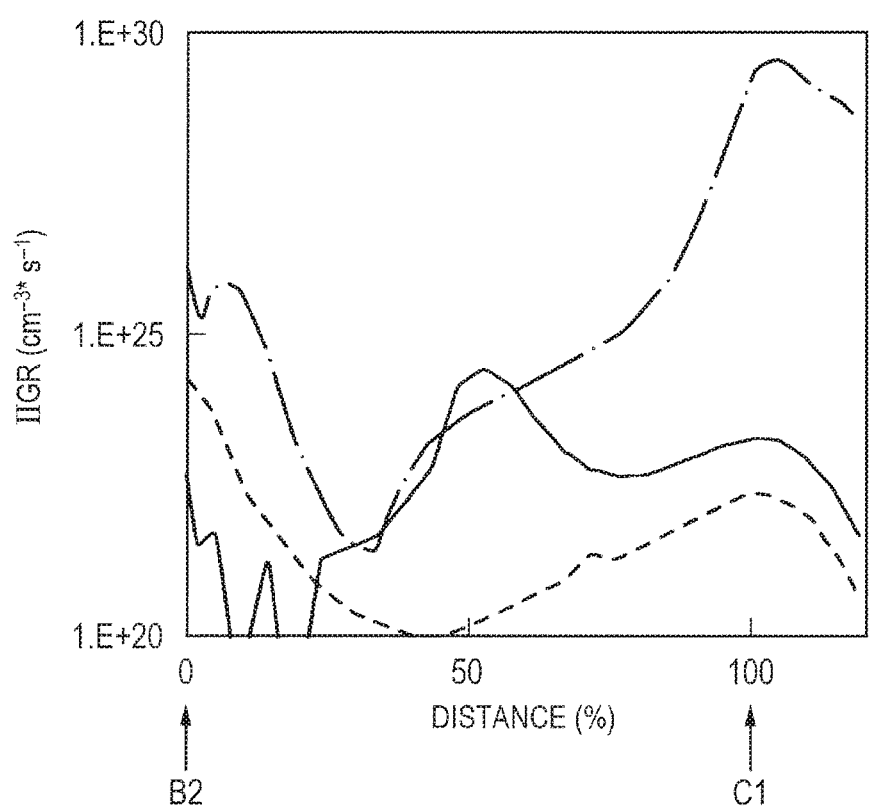
FIG. 14 is a graphic representation showing an impact ionization generation rate on the side of the semiconductor substrate at the bottom of the separation insulating film.

As shown in FIG. 9, when the width Lt of the trench HL is further increased from about 50%, the gate current rises conversely. The reason for this is that as shown in FIGS. 13 and 14, a high electric field region shifts to the drain side and the amount of impact ionization increases so that the gate current Ig flows via the bottom of the trench HL. FIG. 13 is a graphic representation of simulation results showing the electric field on a boundary line B2-C1 in the sectional view of FIG. 10, i.e., on the side of the semiconductor substrate SB at the bottom of the separation insulating film SIS. FIG. 14 is a graphic representation of simulation results showing the impact ionization generation rate (IIGR) on the boundary line B2-C1 in the sectional view of FIG. 10, i.e., on the side of the semiconductor substrate SB at the bottom of the separation insulating film SIS.

In FIGS. 13 and 14, the results about the LDMOS transistor PD1 of the first embodiment are plotted by solid lines and dashed lines, and the results regarding the LDMOS transistor CD2 (see FIG. 38) of the first comparative example are plotted by broken lines. Here, in the graph of the first embodiment plotted by solid lines, the distance ratio Lt/Lov is 43%; in the graph of the first embodiment plotted by dashed lines, the distance ratio Lt/Lov is 98%; and in the graph of the first comparative example plotted by broken lines, the width Lt is 0. Also in FIGS. 13 and 14, the distance ratio Ls/Lov is fixed to 6.8% and the depth ratio Lx/Ly is fixed to 77%.

Figure 15:
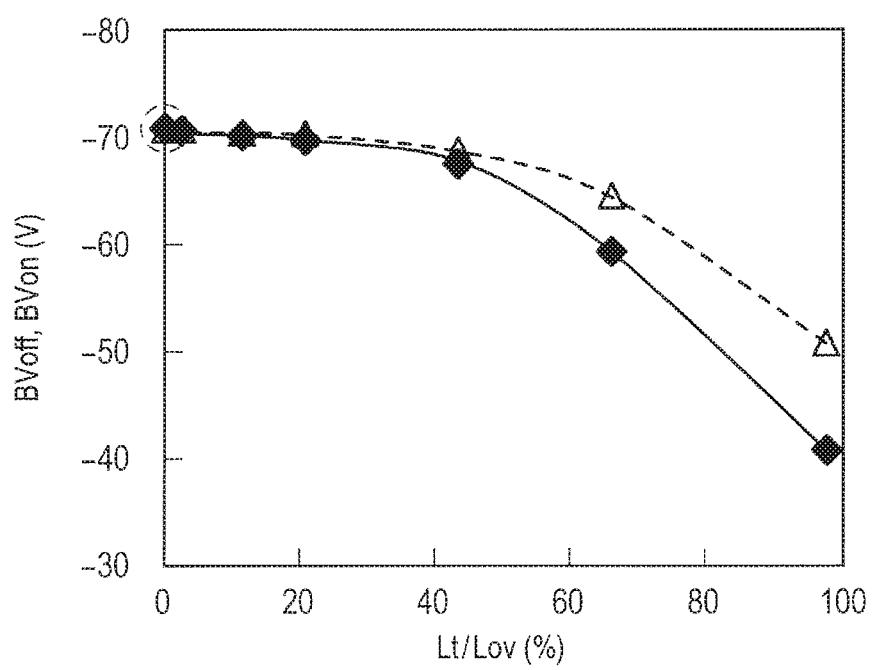
FIG. 15 is a graphic representation showing changes in off-breakdown voltage and on-breakdown voltage with regard to the trench width.

FIG. 15 is a graphic representation of device simulation results showing changes in off-breakdown voltage BVoff and on-breakdown voltage BVon with regard to the width Lt of the trench HL shown in FIG. 2. As in FIG. 9, the horizontal axis of the graphs denotes the ratio (in percentage) of the width Lt of the trench HL to the length Lov as the amount of covering of the gate electrode GE with regard to the separation insulating film SIS. The value of the length Lov is constant. In FIG. 15, the solid-line graph plotting solid lozenges represents measurements of the off-breakdown voltage BVoff and the broken-line graph plotting hollow triangles denotes measurements of the on-breakdown voltage BVon regarding the LDMOS transistor PD1 (see FIG. 2) of the first embodiment.

Both the off-breakdown voltage BVoff and the on-breakdown voltage BVon drop abruptly when the width Lt exceeds about 50%. If the width Lt is about 50% or less, the declines in the off-breakdown voltage BVoff and the on-breakdown voltage BVon are negligible. If follows that if the width Lt is set to about, say, 40%, the gate current Ig can be reduced by three orders of magnitude with a negligible decline in each breakdown voltage (see FIG. 9). That is, the hot carrier characteristics are improved and the gate current Ig is prevented from flowing via the gate insulating film GIS, so that the service life of the semiconductor device is prolonged. As explained, the width Lt of the trench HL should preferably be determined in such a manner that the declines in the off-breakdown voltage BVoff and the on-breakdown voltage BVon are negligible and that the gate current Ig is made as small as possible.

Figure 16:
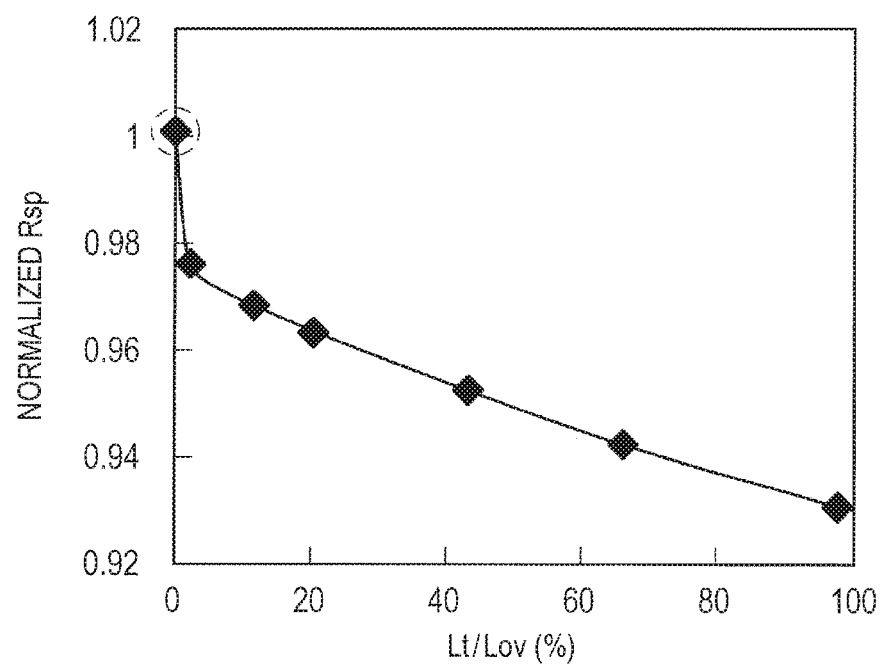
FIG. 16 is a graphic representation showing changes in on-resistance with regard to the trench width.

Explained below is the on-resistance Rsp, another indicator as important as breakdown voltage representative of the performance of the LDMOS transistor. As shown in FIG. 16, when the width Lt of the trench HL is set to about 40%, the structure of the first embodiment provides an improvement of about 5% over the LDMOS transistor CD2 (see FIG. 38) of the first comparative example in which the trench HL is not formed. FIG. 16 is a graphic representation showing relations between the distance ratio Lt/Lov and the on-resistance Rsp. Here, too, the distance ratio Ls/Lov is set to 6.8%, the depth ratio Lx/Ly is set to 77%, and the value of the length Lov is constant. When the width Lt of the trench HL is fixed to 0% as in the LDMOS transistor CD2 (see FIG. 38) of the first comparative example, the on-resistance Rsp takes the value indicated by a broken-line circle in FIG. 16.

The reason the on-resistance Rsp can be reduced as described above is that forming the gate electrode GE inside the trench HL produces a hole accumulation layer in the semiconductor substrate SB immediately under the gate electrode GE, so that the resistance in the semiconductor substrate SB where the accumulation layer is formed is lowered.

On the other hand, in the LDMOS transistor CD2 (see FIG. 38) of the first comparative example, even if the ratio (in percentage) of the length Lov as the amount of covering of the gate electrode GE to the length Ld of the drift region DFT is raised to about 70% that is the upper limit for ensuring at least 70 V of off-breakdown voltage BVoff and on-breakdown voltage BVon, an improvement of only about 2% in on-resistance Rsp can be obtained. Thus the structure of the first embodiment provides the advantage of also offering a relatively large improvement in terms of the reduction of the on-resistance Rsp.

Figure 21:
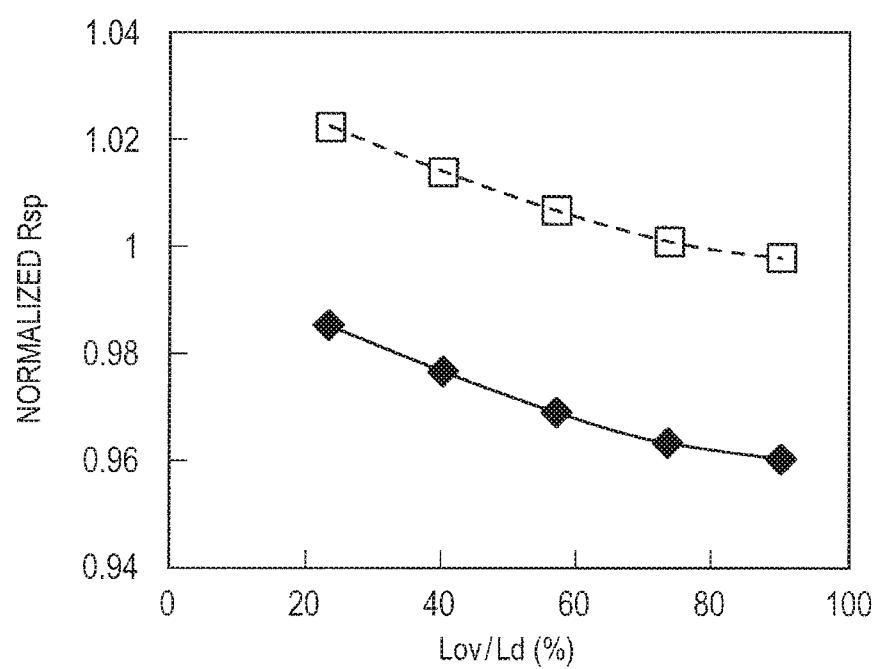
FIG. 21 is a graphic representation showing relations between the ratio of the gate electrode covering amount to distance on the one hand and on-resistance on the other hand.

FIG. 21 is a graphic representation showing relations between the ratio (in percentage) of length Lov to length Ld on the one hand and on-resistance Rsp on the other hand. In FIG. 21, the results about the LDMOS transistor PD1 (see FIG. 2) of the first embodiment are plotted by solid lines, and the results regarding the LDMOS transistor CD2 of the first comparative example are plotted by broken lines. In FIG. 21, the measured distance ratios of the LDMOS transistor PD1 are fixed to Ls/Ld=5%, Lt/Ld=15%, and Lx/Ly=77%. The value of the length Ld is constant.

What follows is an explanation of what has resulted when the distance Ls between the source-side edge of the separation insulating film SIS and the trench HL is varied where the drain-side-edge position of the trench HL shown in FIG. 2 is fixed, i.e., where Ls+Lt is kept constant.

Figure 17:
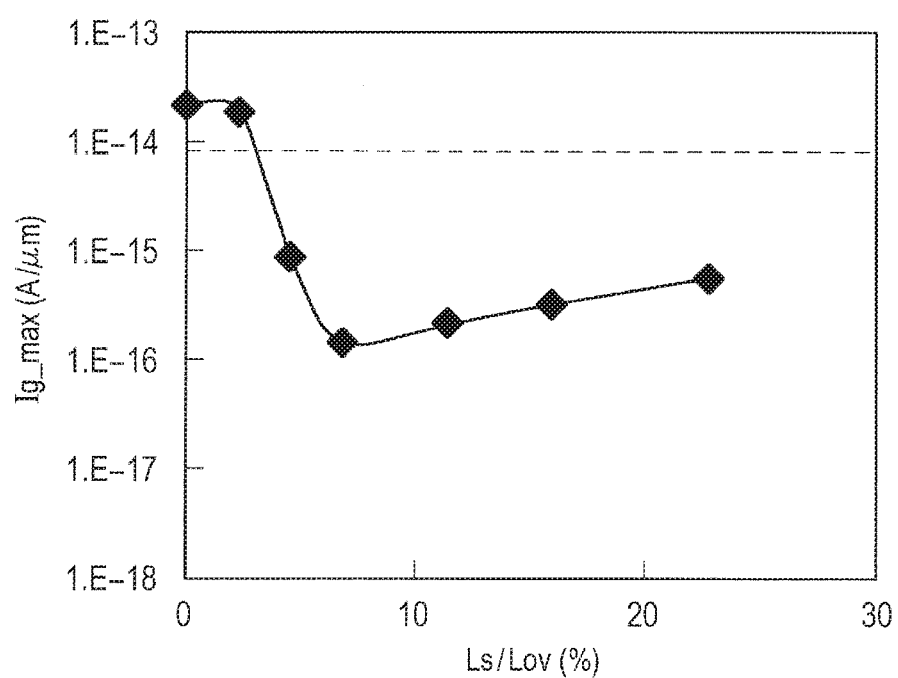
FIG. 17 is a graphic representation showing changes in gate current with regard to the distance between the source-side edge of the separation insulating film and the trench.

FIG. 17 is a graphic representation of device simulation results showing changes in the gate current Ig with regard to the distance Ls between the source-side edge of the separation insulating film SIS and the trench HL. The solid-line graph plotting solid lozenges represents measurements regarding the LDMOS transistor PD1 (see FIG. 2) of the first embodiment. The broken-line graph indicates measurements of the gate current Ig in the LDMOS transistor CD (FIG. 38) of the first comparative example.

Here, the distance Ls between the source-side edge of the separation insulating film SIS and the trench HL is given as the ratio (in percentage) to the length Lov as the amount of covering of the gate electrode GE with regard to the separation insulating film SIS. The value of the length Lov is constant. In this simulation, the distance ratio (Ls+Lt)/Lov is fixed to 27% and the depth ratio Lx/Ly is fixed to 77%.

In part of FIG. 17, the solid-line graph is shown to be higher than the broken-line graph. It can thus be seen that when the length Ls of the trench HL is 0.068 to 2.3% of the length Lov, the gate current Ig in the LDMOS transistor PD1 is made larger than the gate current Ig in the LDMOS transistor CD2 by about one-third order of magnitude. Ls/Lov being 0.068% means that the distance Ls is equivalent to the thickness of the gate insulating film GIS. The reason the gate current Ig has increased in this manner is that an excessively short distance Ls lets the gate current Ig be supplemented with an electronic current flowing through the area between the source-side edge of the separation insulating film SIS and the trench HL shown in FIG. 2. In this application, the thickness of the gate insulating film GIS (film thickness) refers to the distance between the upper and the lower surfaces of the gate insulating film GIS in a direction perpendicular to the principal plane of the semiconductor substrate SB.

That is, where the distance Ls is equivalent to the thickness of the gate insulating film GIS, the gate current Ig rises and the reliability of the semiconductor device drops correspondingly. For this reason, the distance Ls needs to be larger than the film thickness of the gate insulating film GIS. The trench HL is thus formed away from the edge of the separation insulating film SIS on the side of the source region SC. Specifically, the edge of the trench HL on the side of the source region SC is located closer to the drain region DC than to the edge of the separation insulating film SIS on the side of the source region SC.

As shown in FIG. 17, when the distance Ls is increased from 2.3% to about 7%, the gate current Ig is lowered progressively. When the distance Ls is about 7%, the gate current Ig is minimized. When the distance Ls of the trench HL is increased further, the gate current Ig starts to rise. The reason for this is that the gate electrode GE inside the trench HL is distanced away from the source-side edge of the separation insulating film SIS where the electric field is the strongest, so that the field plate effect is weakened.

Figure 18:
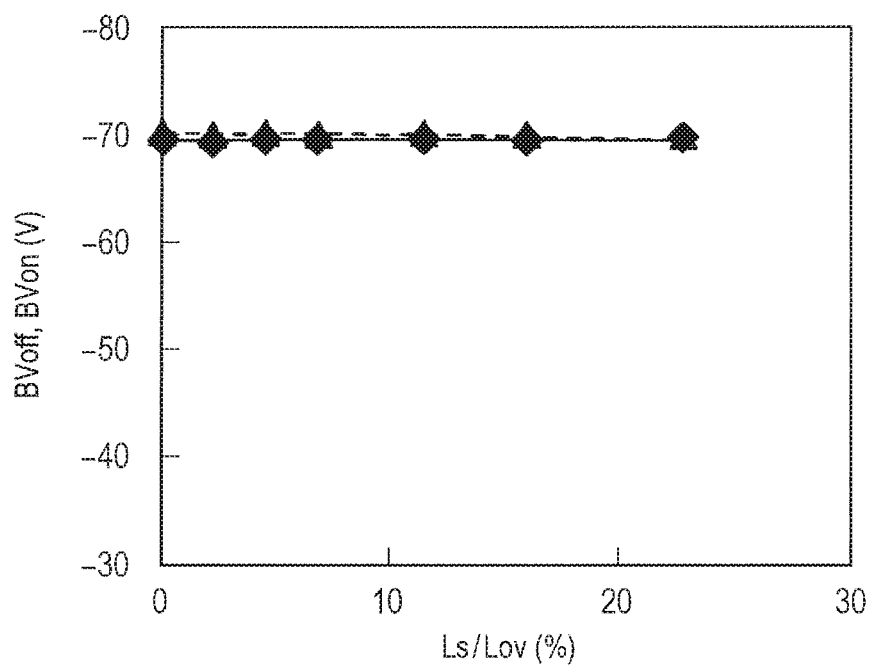
FIG. 18 is a graphic representation showing changes in off-breakdown voltage and on-breakdown voltage with regard to the distance between the source-side edge of the separation insulating film and the trench.

As can be seen from breakdown voltage simulation results in FIG. 18, varying the distance Ls of the trench HL does not lower the off-breakdown voltage BVoff or on-breakdown voltage BVon. FIG. 18 is a graphic representation of device simulation results showing values of the off-breakdown voltage BVoff and on-breakdown voltage BVon with regard to the distance Ls. In FIG. 18, the solid-line graph plotting solid lozenges and the broken-line graph plotting hollow triangles denote measurements of the off-breakdown voltage BVoff and on-breakdown voltage BVon, respectively, in the LDMOS transistor PD1 (see FIG. 2) of the first embodiment.

In FIG. 18, the distance Ls between the source-side edge of the separation insulating film SIS and the trench HL shown in FIG. 2 is given as the ratio (in percentage) to the length Lov as the amount of covering of the gate electrode GE with regard to the separation insulating film SIS. The value of the length Lov is constant. In this simulation, the distance ratio (Ls+Lt)/Lov is fixed to 27% and the depth ratio Lx/Ly is fixed to 77%.

As described, when the distance Ls of the trench HL is to be determined, an optimum distance value should preferably be selected to make the gate current Ig as small as possible. For example, if the distance Ls is approximately equivalent to the thickness of the gate insulating film GIS, the gate current Ig becomes larger than in the LDMOS transistor CD2, which is not desirable. The value of the distance Ls needs to be larger than the film thickness of the gate insulating film GIS.

The edge of the trench HL on the side of the drain region DC is positioned closer to the source region SC than to the edge of the gate electrode GE on the side of the drain region DC. That is, the gate electrode GE is formed in a manner extending beyond the trench HL toward the drain region DC. In other words, in an area on the side of the drain region DC beyond the trench HL, the separation insulating film SIS is interposed between the gate electrode GE and the semiconductor substrate SB immediately under the gate electrode GE. If the gate electrode GE were not extended beyond the trench HL toward the drain region DC, the field plate effect would be insufficient, which would lead to the problem of the electric field becoming larger in the semiconductor substrate SB under the gate electrode GE.

Thus in the first embodiment, the edge of the gate electrode GE on the side of the drain region DC is not terminated at the trench or on the side of the source region SC but located on the side of the drain region DC beyond immediately above the edge of the trench HL on the side of the drain region DC. In other words, the trench HL is formed on the side of the source region SC away from the edge of the gate electrode GE on the side of the drain region DC.

Figure 19:
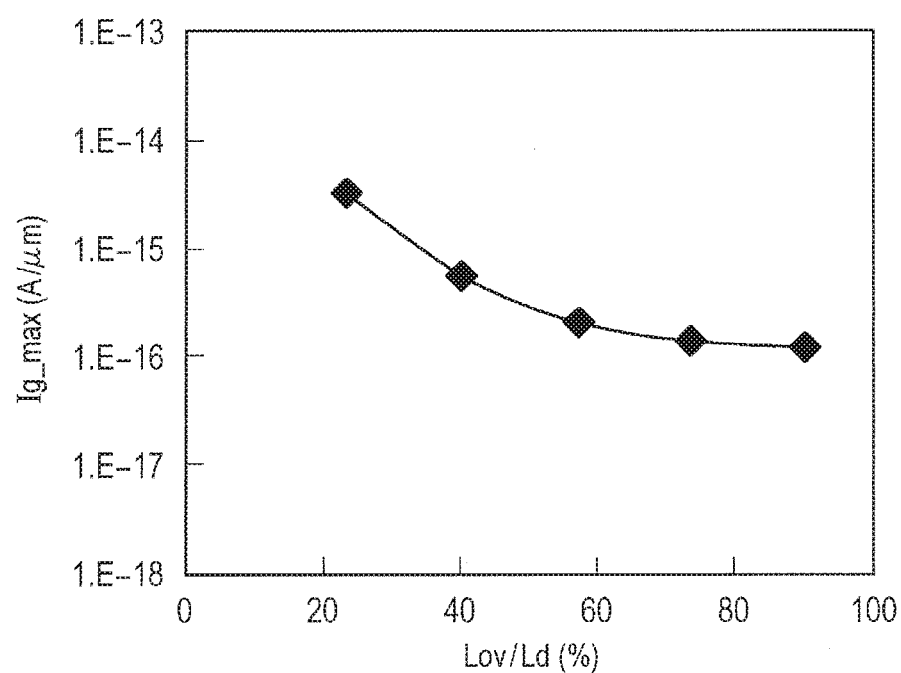
FIG. 19 is a graphic representation showing changes in gate current with regard to the amount of covering of the gate electrode.

Explained below is what results from varying the length Lov as the amount of covering of the gate electrode GE with regard to the separation insulating film SIS. FIG. 19 is a graphic representation of device simulation results showing changes in the gate current Ig with respect to the length Lov as the amount of covering of the gate electrode GE regarding the separation insulating film SIS. Here, the length Lov is given as the ratio (in percentage) to the length Ld of the drift region DFT immediately under the separation insulating film SIS shown in FIG. 2. The length Ld of the drift region DFT immediately under the separation insulating film SIS is constant. In this simulation with regard to the structure of the LDMOS transistor PD1 (see FIG. 2), the distance ratio Ls/Ld is fixed to 5.0%, the distance ratio Lt/Ld is fixed to 15%, and the depth ratio Lx/Ly is fixed to 77%. Also in FIG. 19, the solid-line graph plotting solid lozenges indicates measurements regarding the LDMOS transistor PD1 (see FIG. 2) of the first embodiment.

As shown in FIG. 19, when the length Lov as the amount of covering of the gate electrode GE is made progressively smaller, the electric field at the source-side edge of the separation insulating film SIS is intensified, so that the gate current IG becomes larger. When the length Lov drops below 50%, the off-breakdown voltage BVoff declines as shown by breakdown voltage simulation results in FIG. 20. That is because an intensified electric field at the source-side edge of the separation insulating film SIS has caused a breakdown point in the off-state to shift from the surface of the semiconductor substrate SB immediately under the drain-side edge of the gate electrode GE to the source-side edge of the separation insulating film SIS, the electric field thus determining the off-breakdown voltage BVoff. The breakdown point refers to the location where the electric field is maximized. At the breakdown point, impact ionization takes place and incurs electron-hole pairs.

Figure 20:
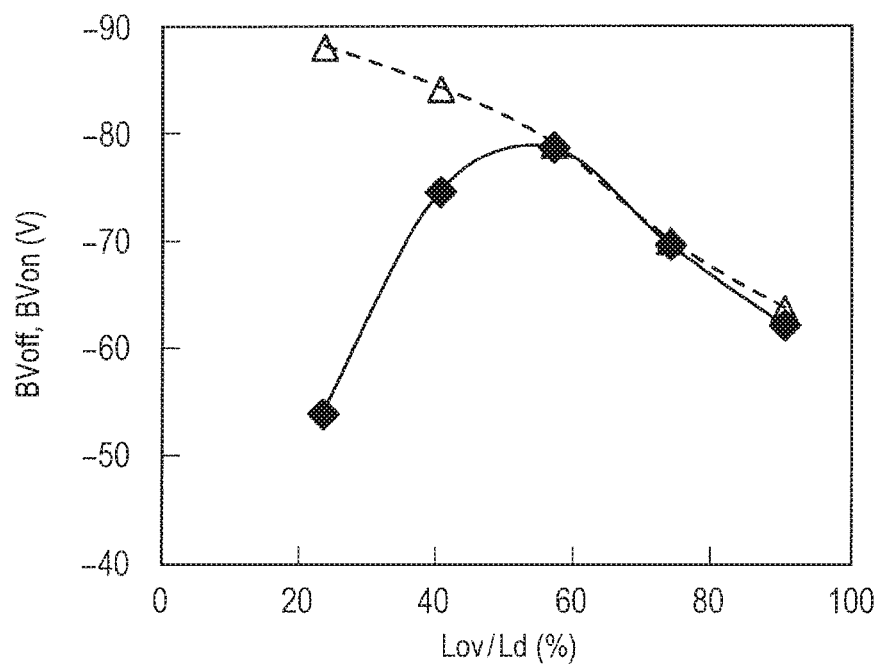
FIG. 20 is a graphic representation showing relations between the ratio of the gate electrode covering amount to distance on the one hand and on-breakdown voltage and off-breakdown voltage on the other hand.

FIG. 20 is a graphic representation showing relations between the distance ratio Lov/Ld on the one hand and the off-breakdown voltage BVoff and on-breakdown voltage BVon on the other hand. In this simulation with regard to the structure of the LDMOS transistor PD1 (see FIG. 2), the distance ratio Ls/Ld is fixed to 5.0%, the distance ratio Lt/Ld is fixed to 15%, and the depth ratio Lx/Ly is fixed to 77%. In FIG. 20, the solid-line graph plotting solid lozenges and the broken-line graph plotting hollow triangles denote measurements of the off-breakdown voltage BVoff and on-breakdown voltage BVon, respectively, in the LDMOS transistor PD1 (see FIG. 2) of the first embodiment.

As shown by simulation results of on-resistance Rsp in FIG. 21, the on-resistance Rsp is also increased the shorter the length Lov is made. It can thus be seen that forming the gate electrode GE inside the trench HL shown in FIG. 2 and sufficiently prolonging the length Lov as the amount of covering of the gate electrode GE are both indispensable for improving overall characteristics including the on-resistance Rsp, breakdown voltage, and gate current Ig. That is, the length Lov as the amount of covering needs to be set in such a manner that the gate electrode GE sufficiently covers the trench HL.

Figure 22:
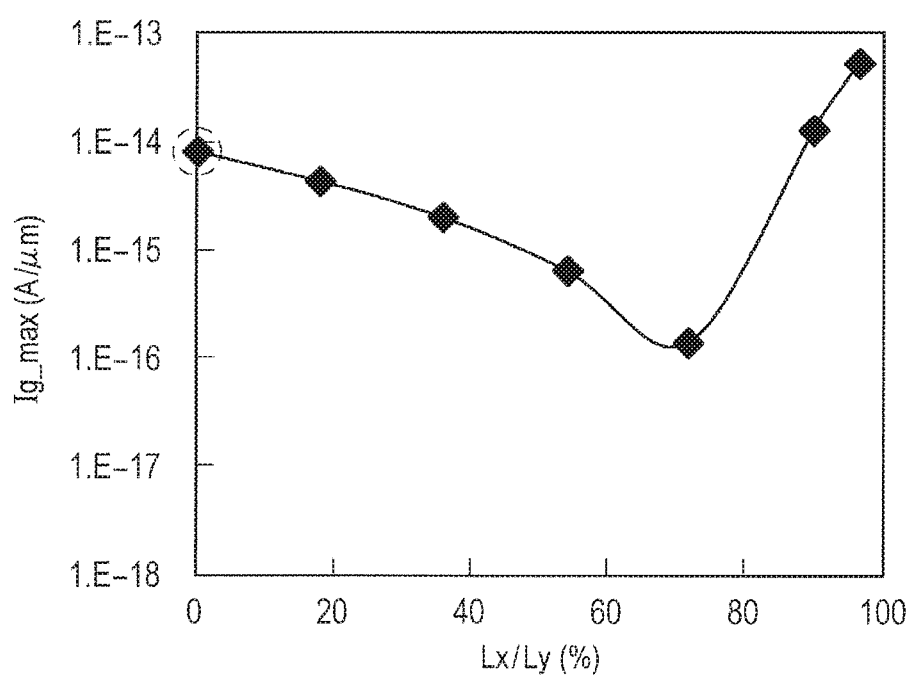
FIG. 22 is a graphic representation showing changes in gate current with regard to the trench depth.

Explained next is the structure of the semiconductor device as the first embodiment, with emphasis on how the gate current Ig is affected by the depth Lx of the gate electrode GE in the trench HL. FIG. 22 is a graphic representation of device simulation results showing changes in the gate current Ig with regard to the depth Lx of the trench HL shown in FIG. 2. Here, the depth Lx is given as the ratio (in percentage) to the thickness Ly of the separation insulating film SIS. The thickness Ly is constant. In this simulation and in the graphs of FIGS. 23 through 25 to be discussed later, the distance ratio Ls/Lov is fixed to 6.8% and the distance ratio Lt/Lov is fixed to 20%. Where the trench HL is not formed as in the LDMOS transistor CD2 (see FIG. 38) of the first comparative example, i.e., where the length Lx of the trench HL is 0, the gate current Ig takes the value indicated by a broken-line circle in FIG. 22.

As shown in FIG. 22, when the depth ratio Lx/Ly of the trench HL is increased from 0% to 77%, the gate current Ig declines progressively and is minimized at about 77%. Here, compared with the case where the depth ratio Lx/Ly is 0%, the gate current Ig drops by about one order of magnitude when the depth ratio Lx/Ly is 33%, so that excellent gate current characteristics are obtained. The reason the gate current Ig declines in this manner is that the field plate effect of the gate electrode GE in the trench HL is intensified. At this point, as indicated by breakdown voltage simulation results in FIG. 23, no decline is observed in the off-breakdown voltage BVoff and on-breakdown voltage BVon.

Figure 23:
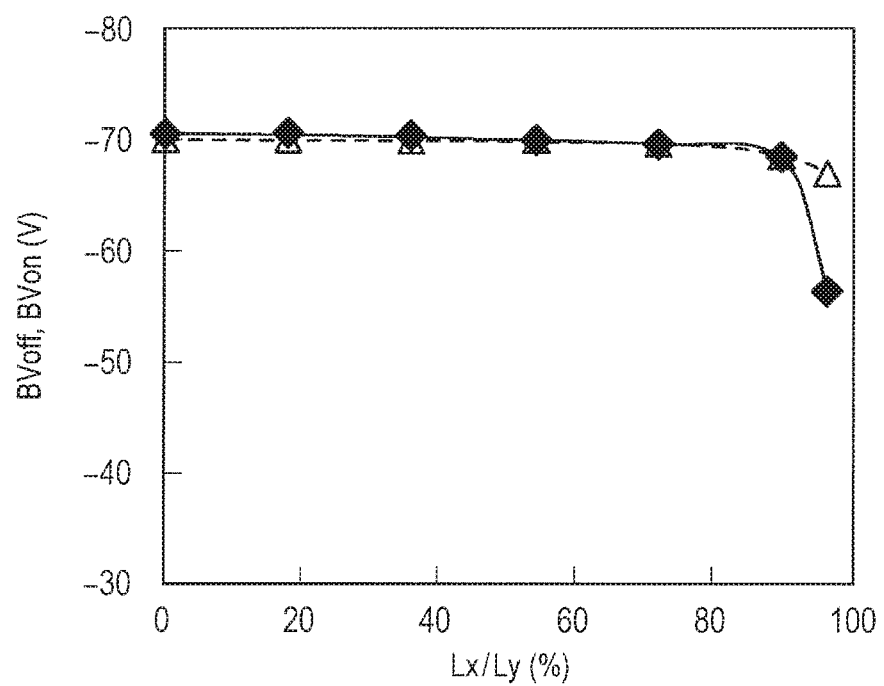
FIG. 23 is a graphic representation showing relations of off-breakdown voltage and on-breakdown voltage with regard to the trench depth.

FIG. 23 is a graphic representation showing relations between the depth ratio Lx/Ly on the one hand and the off-breakdown voltage BVoff and on-breakdown voltage BVon on the other hand. In FIG. 23, the solid-line graph plotting solid lozenges and the broken-line graph plotting hollow triangles denote measurements of the off-breakdown voltage BVoff and on-breakdown voltage BVon, respectively, in the LDMOS transistor PD1 (see FIG. 2) of the first embodiment.

As shown in FIG. 22, when the depth ratio Lx/Ly of the trench HL is further increase from about 77%, the gate current Ig starts to rise. That is because the electric field at the bottom of the trench HL is intensified and the amount of impact ionization is increased accordingly, as indicated by electric field simulation results in FIG. 24 and by simulation results of the impact ionization generation rate in FIG. 25. If the depth ratio Lx/Ly of the trench HL is increased excessively from 77%, there is concern that the separation insulating film SIS left at the bottom of the trench HL becomes thinner so that a large gate current Ig may flow through the film and incur insulating film breakdown.

Figure 24:
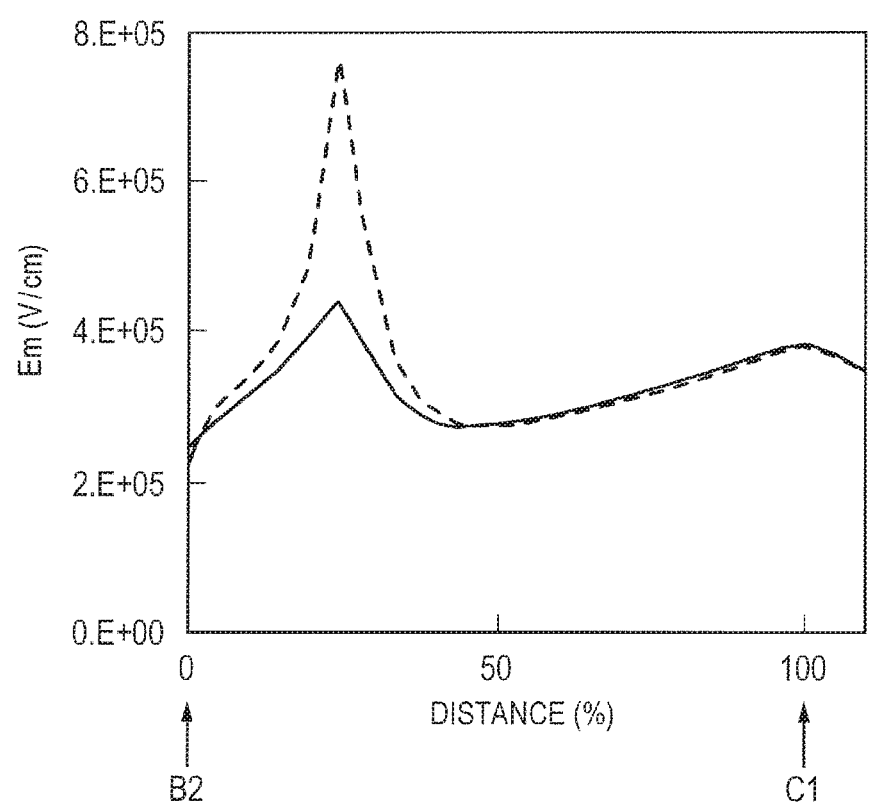
FIG. 24 is a graphic representation showing an electric field on the side of the semiconductor substrate at the bottom of the separation insulating film.
Figure 25:
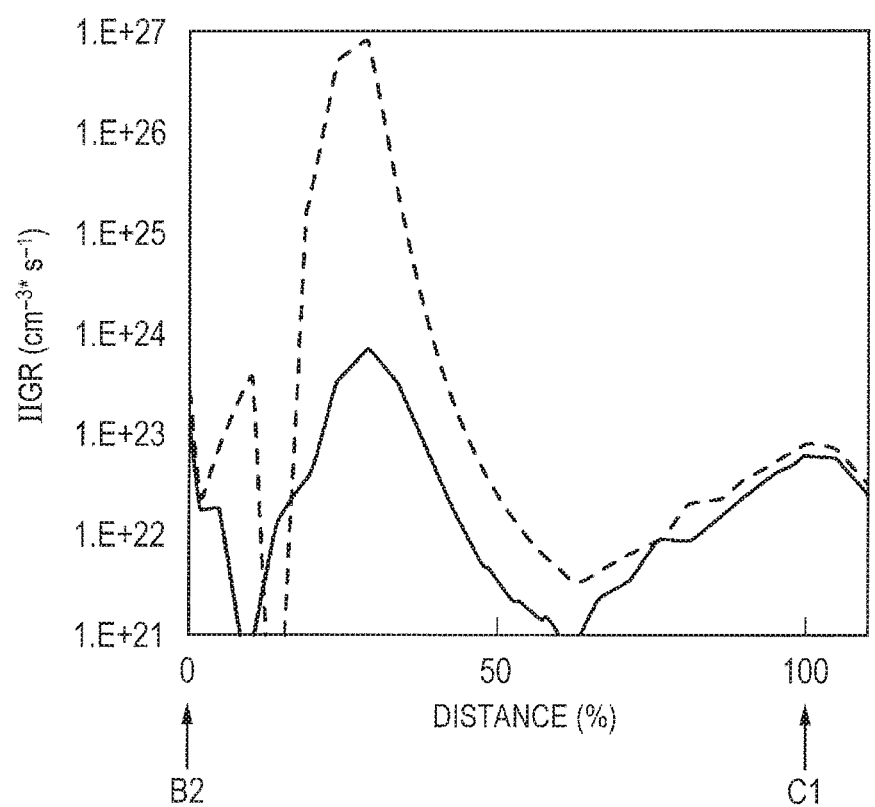
FIG. 25 is a graphic representation showing an impact ionization generation rate on the side of the semiconductor substrate at the bottom of the separation insulating film.

FIG. 24 is a graphic representation of simulation results about the electric field on the side of the semiconductor substrate SB on the boundary line B2-C1 in the sectional view of FIG. 10. FIG. 25 is a graphic representation of simulation results about the impact ionization generation rate (IIGR) on the side of the semiconductor substrate SB also on the boundary line B2-C1 in the sectional view of FIG. 10.

As described above, the depth of the trench HL should also be set preferably to an optimum value that will make the gate current Ig as small as possible. For example, where the depth ratio Lx/Ly is 96%, that means the thickness of the insulating film left at the bottom of the trench HL is approximately equivalent to the thickness of the gate insulating film GIS. In this case, the gate current Ig is made larger than in the LDMOS transistor CD2 (see FIG. 38) of the first comparative example where the trench HL is not formed, which is not desirable. Preferably, the thickness of the separation insulating film SIS at the bottom of the trench HL should be larger than the film thickness of the gate insulating film GIS. For this reason, the bottom of the trench HL is located halfway through the depth of the separation insulating film SIS; the trench HL does not penetrate the separation insulating film SIS.

Thus from the viewpoint of reducing the gate current Ig by weakening the electric field at the bottom of the trench HL, the depth of the trench HL should preferably be at least 33% of the film thickness of the separation insulating film SIS. That is, the depth of the trench HL should preferably be at least one-third of the film thickness of the separation insulating film SIS. It is also preferable that the film thickness of the separation insulating film SIS immediately under the trench HL be larger than the film thickness of the gate insulating film GIS.

Second Embodiment

Figure 26:
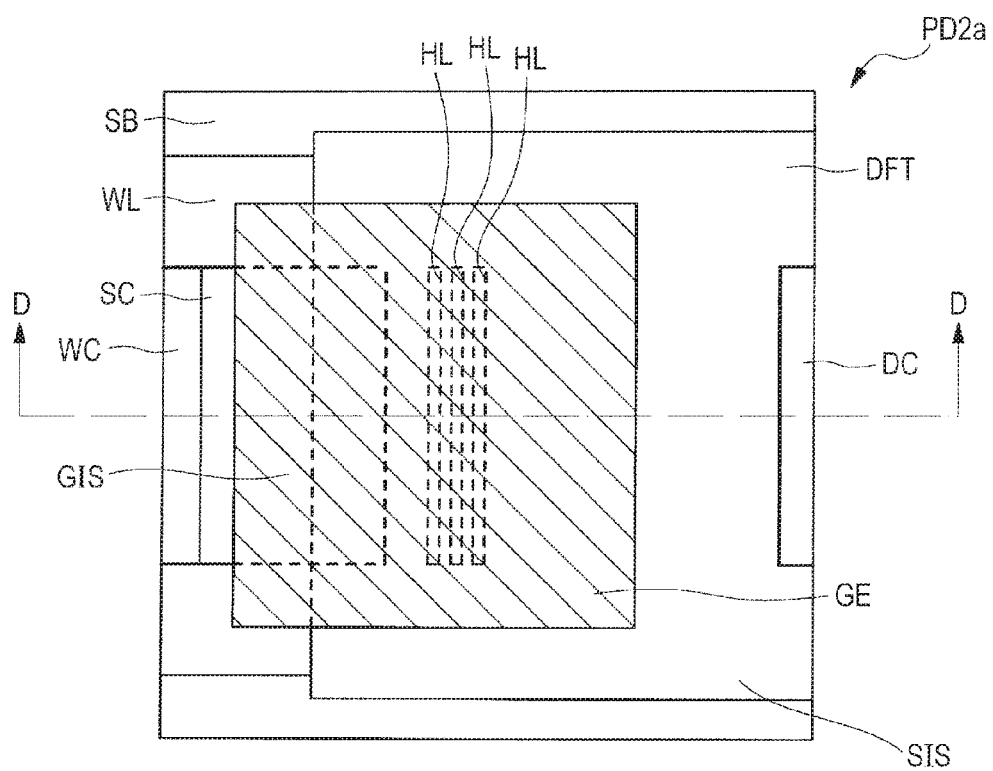
FIG. 26 is a plan view showing a semiconductor device as a second embodiment of the present invention.
Figure 27:
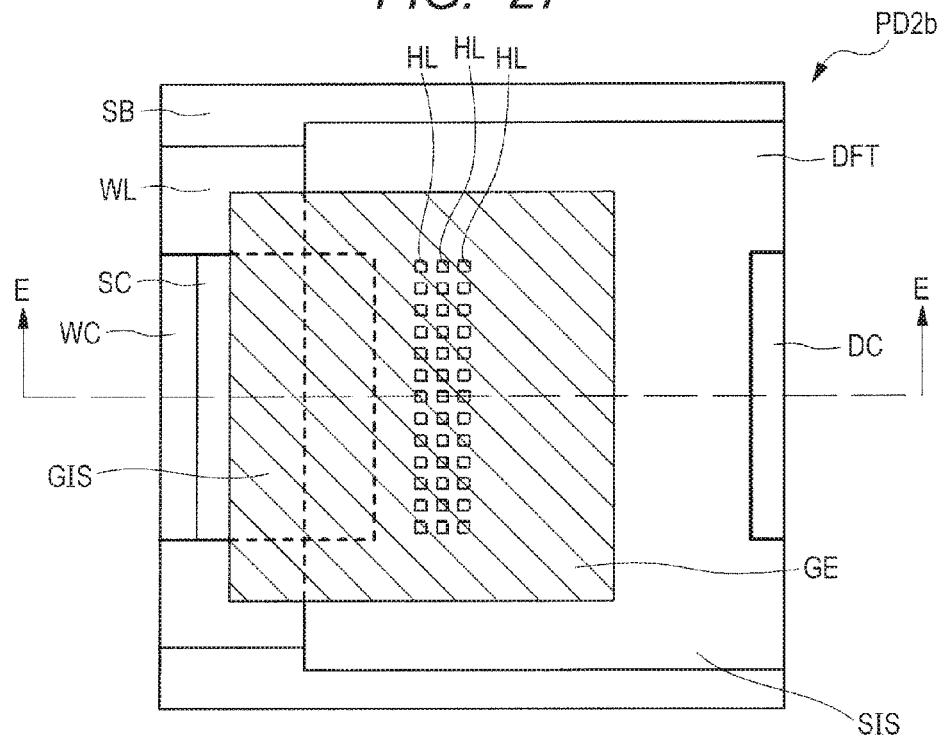
FIG. 27 is a plan view showing a variation of the semiconductor device as the second embodiment.
Figure 28:
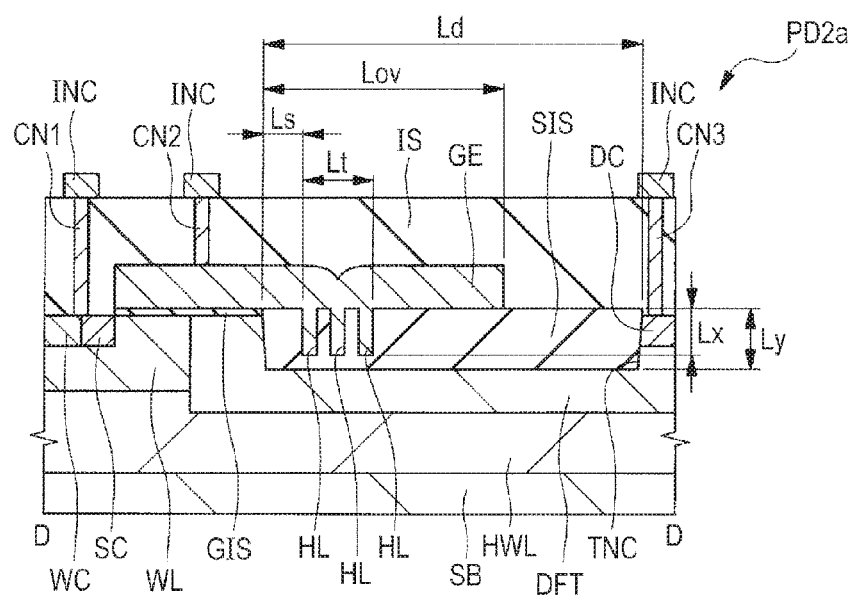
FIG. 28 is a sectional view taken along line D-D in FIG. 26.

Explained below with reference to FIGS. 26 through 28 is the second embodiment in which the width of each of multiple trenches formed over the top surface of the separation insulating film of the LDMOS transistor is made smaller than in the first embodiment. FIG. 26 is a plan view showing an LDMOS transistor PD2a as a semiconductor device of the second embodiment. FIG. 27 is a plan view showing an LDMOS transistor PD2b as a variation of the semiconductor device of the second embodiment. FIG. 28 is a sectional view of the LDMOS transistor PD2a as the semiconductor device of the second embodiment, the sectional view being taken along line D-D in FIG. 26. Incidentally, the sectional view taken along line E-E in FIG. 27 gives the same structure as the sectional view shown in FIG. 27.

The LDMOS transistor PD2a shown in FIG. 28 is a P-channel type element as in the first embodiment explained above with reference to FIG. 2. Except that there are multiple trenches HL formed therein, the LDMOS transistor PD2a of the second embodiment has the same structure as the LDMOS transistor PD1 (see FIG. 2) explained above in connection with the first embodiment. In planar view, the trenches HL may be shaped to be a slit each as shown FIG. 26 or as a series of dots each as indicated in FIG. 27. The interval between the slits or between the dots may be either constant or different.

Figure 29:
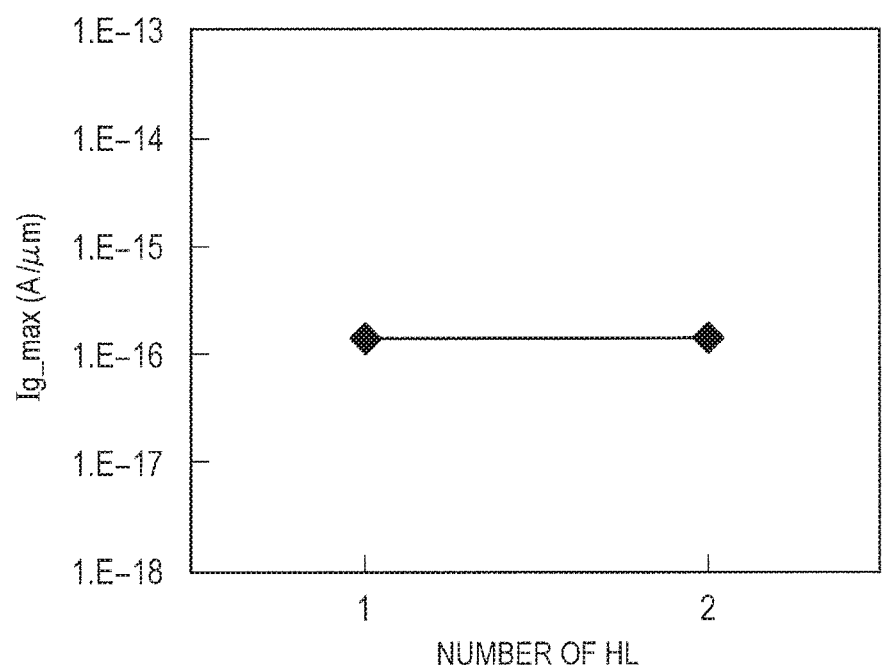
FIG. 29 is a graphic representation comparing the first embodiment with the second embodiment in terms of the gate current of the LDMOS transistor therein.

FIG. 29 is a graphic representation comparing the gate current Ig in the LDMOS transistor PD2a of the second embodiment with the gate current Ig in the LDMOS transistor PD1 (see FIG. 2). With regard to the LDMOS transistor PD2a shown in FIG. 28, reference character Ls represents the shortest distance from the source-side edge of the separation insulating film SIS to the trench HL, and reference character Lt denotes the width of an entire trench region including all trenches HL in the source-drain direction. In FIG. 29, as well as in FIGS. 30 and 31 to be discussed later, the distance ratio Ls/Lov is fixed to 6.8%, the distance ratio Lt/Lov is fixed to 20%, and the depth ratio Lx/Ly is fixed to 77%.

Figure 30:
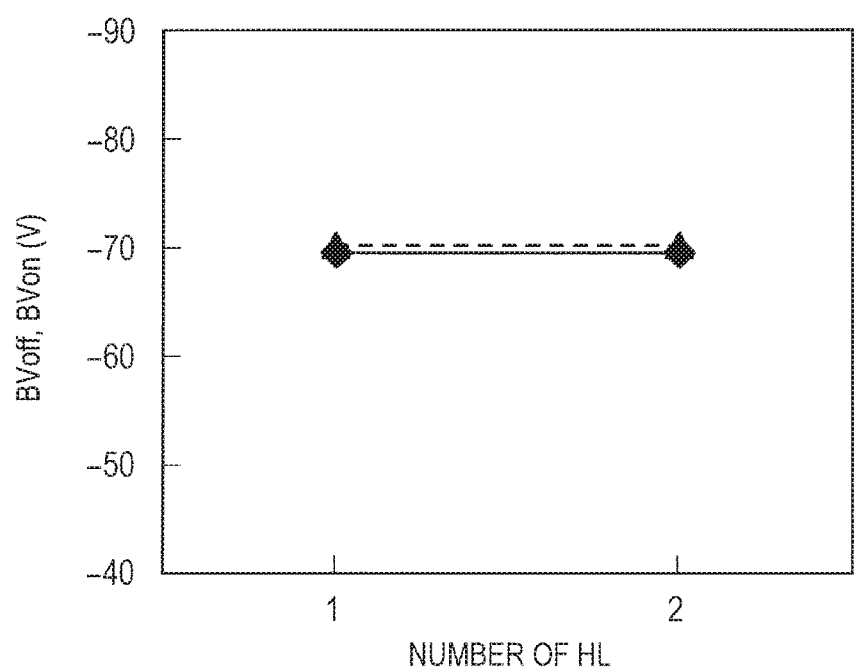
FIG. 30 is a graphic representation comparing the first embodiment with the second embodiment in terms of the on-breakdown voltage and off-breakdown voltage of the LDMOS transistor therein.
Figure 31:
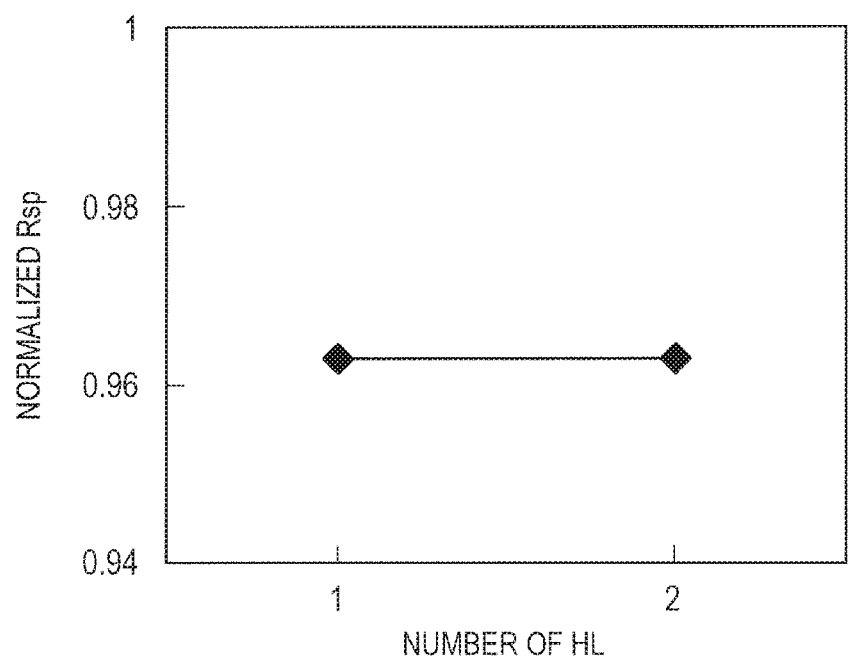
FIG. 31 is a graphic representation comparing the first embodiment with the second embodiment in terms of the on-resistance of the LDMOS transistor therein.

As shown in FIG. 29, comparing the LDMOS transistor PD2a with the LDMOS transistor PD1 reveals that as long as the values Ls and Lt in the LDMOS transistor PD2a are respectively equal to the values Ls and Lt in the LDMOS transistor PD1, the LDMOS transistor PD2a offers the same effects as the above-described first embodiment. And as shown in FIGS. 30 and 31, the values of the off-breakdown voltage BVoff, on-breakdown voltage BVon, and on-resistance Rsp in the second embodiment are kept equivalent to those in the first embodiment. That is, the LDMOS transistor PD2a of the second embodiment provides the same effects as its counterpart of the first embodiment discussed above.

FIG. 30 is a graphic representation comparing the LDMOS transistor PD2a with the LDMOS transistor PD1 in terms of off-breakdown voltage BVoff and on-breakdown voltage BV. In FIG. 30, the off-breakdown voltage BVoff is indicated by a solid-line graph and the on-breakdown voltage BVon by a broken-line graph. FIG. 31 is a graphic representation comparing the LDMOS transistor PD2a with the LDMOS transistor PD1 in terms of on-resistance Rsp. As with the LDMOS transistor PD2a shown in FIGS. 26 and 28, the LDMOS transistor PD2b indicated in FIG. 27 offers the same effects as the first embodiment described above.

Furthermore, the width of each of the multiple trenches HL in the second embodiment is smaller than in the first embodiment, so that polysilicon making up the gate electrode GE can easily fill in the trenches HL thereby smoothing the staggered polysilicon surfaces over the trenches HL. That is, where the width of the trench HL is large, the upper surface of the gate electrode GE filling in the trench HL forms a large concave portion with a stagger that can cause problems during treatment. With the second embodiment, there is no concern for such problems. Specifically, the second embodiment eliminates among others the problem which, anticipated upon treatment of the gate electrode GE, involves residuals of the ARC (anti-reflective coating) left in the staggered portion, the ARC being for use during microfabrication.

Third Embodiment

The third embodiment is explained below with emphasis on how a liner insulating film is formed at the bottom of the separation insulating film of the LDMOS transistor.

Figure 32:
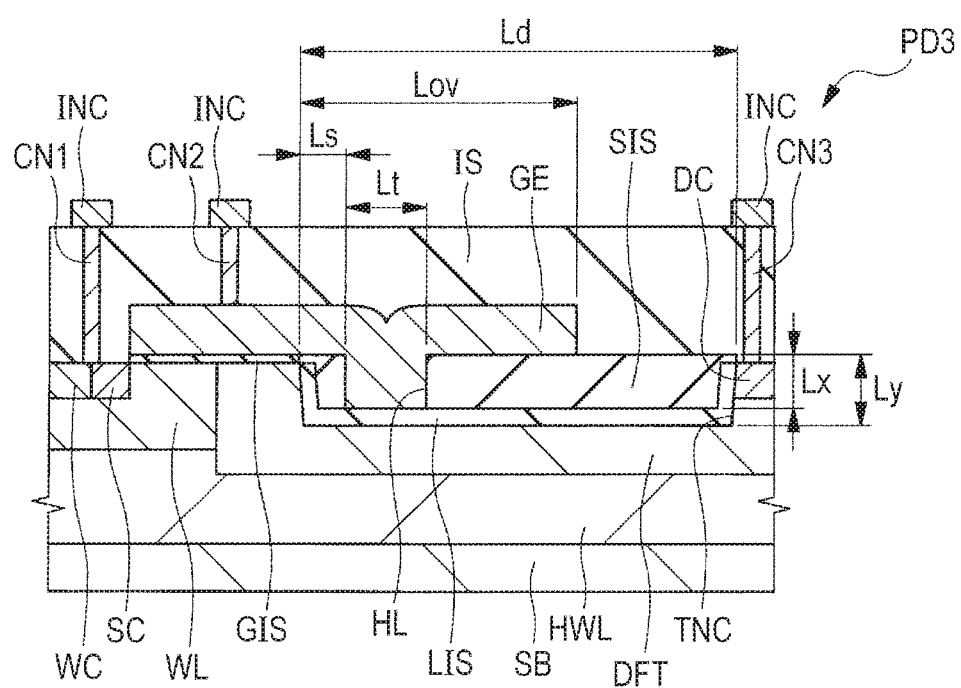
FIG. 32 is a sectional view showing a semiconductor device as a third embodiment of the present invention.

FIG. 32 is a sectional view showing an LDMOS transistor PD3 as the semiconductor device of the third embodiment. Except that a liner insulating film LIS is formed under the separation insulating film SIS, the LDMOS transistor PD3 has the same structure as the LDMOS transistor PD1 (see FIG. 2) of the first embodiment. That is, the separation insulating film SIS is formed in the trench TNC with the liner insulating film LIS interposed therebetween. Specifically, the liner insulating film LIS and the separation insulating film SIS are formed, in that order, over the bottom of the trench TNC. The liner insulating film LIS is typically made of a silicon nitride film. This structure also provides the same effects as the above-described first embodiment.

Here, the liner insulating film LIS also forms a separation insulating film. That is, in the third embodiment, the separation insulating film has a layered structure made of two insulating films. The bottom of the trench HL reaches the boundary between the two insulating films, i.e., the boundary between the separation insulating film SIS and the liner insulating film LIS. That is, the trench HL reaches the liner insulating film LIS, while the bottom of the trench HL does not reach the bottom of the separation insulating film that includes the separation insulating film SIS and the liner insulating film LIS. In other words, in a structure in which the separation insulating film is made of multiple insulating films, the trench HL reaches the bottommost of the multiple films making up the separation insulating film.

Furthermore, when anisotropic etching is carried out on the third embodiment to form the trench HL over the upper surface of the separation insulating film SIS, different etch selectivity ratios of the separation insulating film SIS and liner insulating film LIS make it relatively easy to stop formation of the trench HL immediately above the liner insulating film LIS. That in turn allows the depth Lx of the trench HL to be controlled with the thickness of the liner insulating film LIS. As a result, the controllability of the depth of the trench HL is improved, so that reduction of the gate current Ig is attained in a relatively stable manner.

Fourth Embodiment

Figure 33:
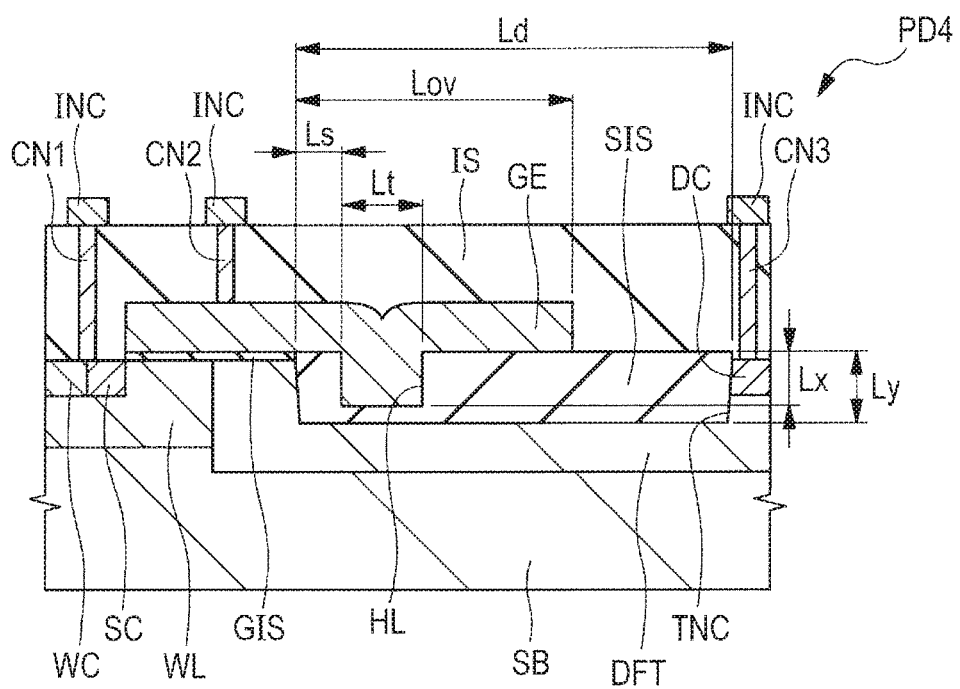
FIG. 33 is a sectional view showing a semiconductor device as a fourth embodiment of the present invention.

FIG. 33 is a sectional view showing an LDMOS transistor PD4 as the semiconductor device of the fourth embodiment. The LDMOS transistor PD4 is a variation of the LDMOS transistor PD1 (see FIG. 2) in the first embodiment discussed above, the LDMOS transistor PD4 being an N-channel type MOS transistor different in type from its counterpart of the first embodiment. The fourth embodiment also offers an enhanced field plate effect thanks to the gate electrode GE embedded in the trench HL. Thus as indicated by simulation results in FIG. 34, the LDMOS transistor PD4 makes the electric field smaller than the N-channel type LDMOS transistor CD1 (see FIG. 37) of the first comparative example, thereby reducing by about one order of magnitude the well current Iw that reflects the magnitude of the impact ionization generation rate (IIGR). In this manner, the semiconductor device of the fourth embodiment can suppress the fluctuations of the on-resistance Rsp under hot carrier stress, so that the reliability of the semiconductor device is improved.

Figure 35:
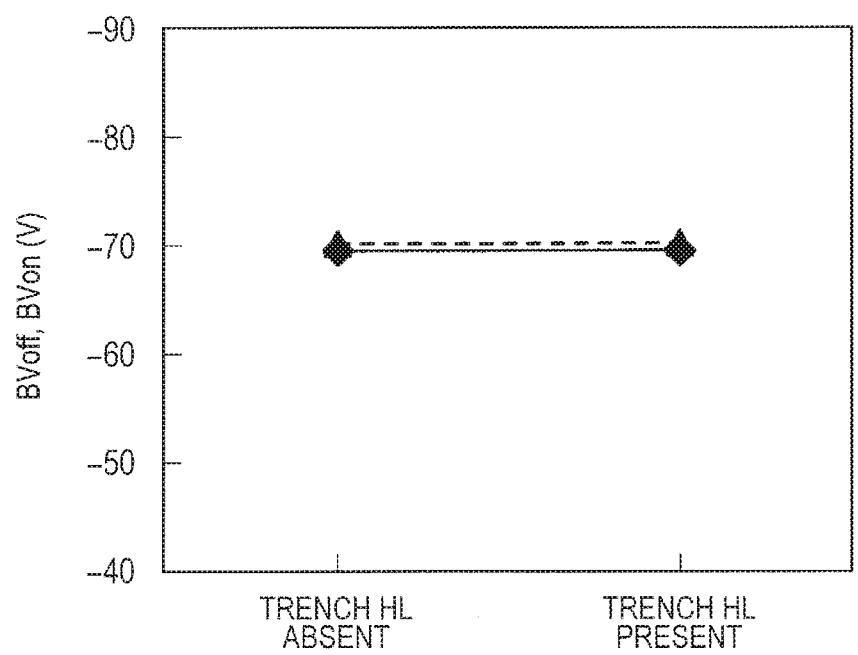
FIG. 35 is a graphic representation comparing the fourth embodiment with the first comparative example in terms of the off-breakdown voltage and on-breakdown voltage of the LDMOS transistor therein.

Here, as indicated by simulation results in FIG. 35, there is no decline in the off-breakdown voltage BVoff and on-breakdown voltage BVon attributable to the formation of the trench HL. Also, as indicated by simulation results in FIG. 36, the fourth embodiment provides the effect of reducing the on-resistance by 6.0%.

Figure 34:
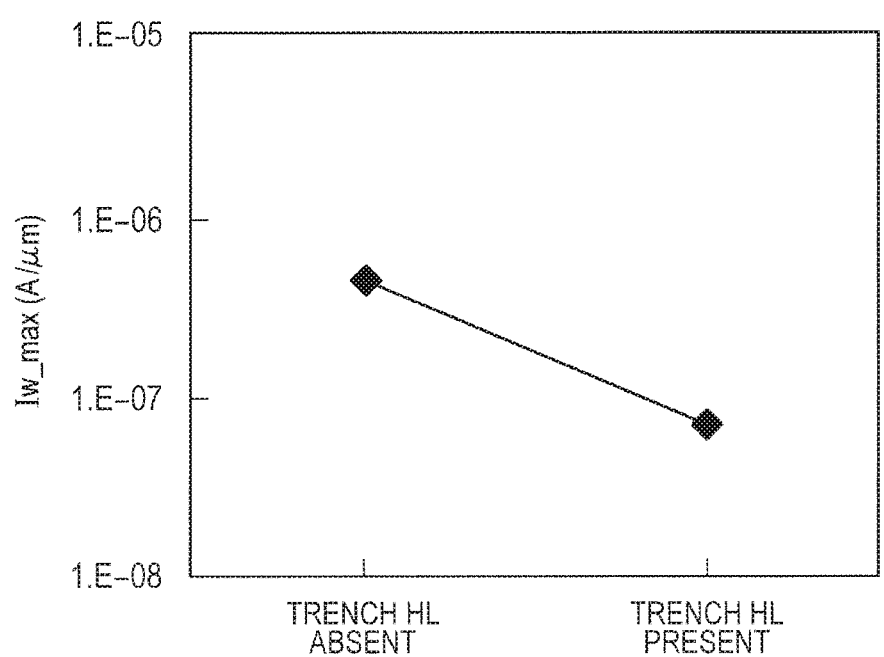
FIG. 34 is a graphic representation comparing the fourth embodiment with a first comparative example in terms of the well current of the LDMOS transistor therein.
Figure 36:
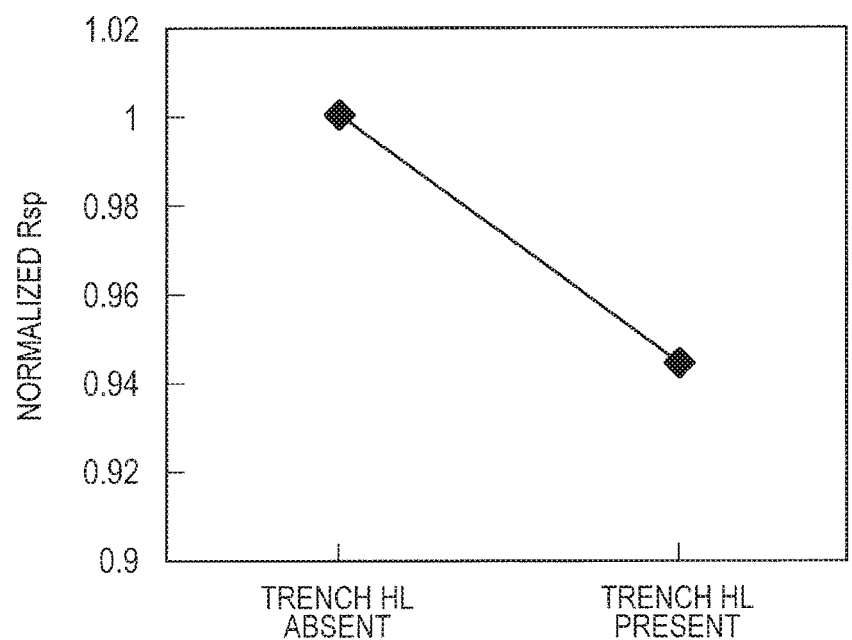
FIG. 36 is a graphic representation comparing the fourth embodiment with the first comparative example in terms of the on-resistance of the LDMOS transistor therein.

FIG. 34 is a graphic representation comparing the LDMOS transistor PD4 with the LDMOS transistor CD1 in terms of the well current Iw therein. FIG. 35 is a graphic representation comparing the LDMOS transistor PD4 with the LDMOS transistor CD1 in terms of the off-breakdown voltage BVoff and on-breakdown voltage BVon thereof. In FIG. 35, the off-breakdown voltage BVoff is indicated by a solid-line graph and the on-breakdown voltage BVon by a broken-line graph. FIG. 36 is a graphic representation comparing the LDMOS transistor PD4 with the LDMOS transistor CD1 in terms of the on-resistance Rsp thereof. In each of FIGS. 34 through 36, the position indicated as "trench HL absent" plots the values of the LDMOS transistor CD1, and the position indicated as "trench HL present" plots the values of the LDMOS transistor PD4.

It is to be understood that while the invention has been described in conjunction with specific embodiments with reference to the accompanying drawings, it is evident that many alternatives, modifications and variations will become apparent to those skilled in the art in light of the foregoing description.

For example, whereas the separation insulating film of the LDMOS transistor in each of the above-described embodiments was explained as having the STI structure, the separation insulating film may alternatively have the LOCOS structure.

It is thus intended that the present invention embrace all such alternatives, modifications and variations as fall within the spirit and scope of the appended claims.

The invention claimed is:

1. A semiconductor device comprising:
  a semiconductor substrate;
  a source region of a first conductivity type paired with a drain region of the first conductivity type, the source region and the drain region disposed over a principal plane of the semiconductor substrate;
  a separation insulating film embedded in an isolation trench formed over the principal plane of the semiconductor substrate between the source region and the drain region;
  a gate insulating film disposed over the semiconductor substrate between the separation insulating film and the source region;
  a gate electrode disposed in a manner extending immediately above the gate insulating film and immediately above the separation insulating film between the source region and the drain region;

a drift region of the first conductivity type disposed in the semiconductor substrate under the separation insulating film, one edge of the drift region being located immediately under the gate insulating film; and a plurality of trenches disposed over the upper surface of the separation insulating film, each of the plurality of the trenches having the gate electrode partially embedded therein, wherein the interval between the gate electrode and the drain region is longer than the interval between the gate electrode and the source region;

wherein a trench of the plurality of trenches that is closest to the source region is located away from an edge of the separation insulating film on the source region side of the separation insulating film, and a trench of the plurality of trenches that is closest to the drain region is disposed away from an edge of the gate electrode that is on the drain region side, wherein a bottom of each of the plurality of trenches is positioned halfway through the depth of the separation insulating film, and wherein the separation insulating film has a structure made of a plurality of layered insulating films.

2. The semiconductor device according to claim 1, wherein the depth of each of the plurality of trenches is at least one-third of the thickness of the separation insulating film, and wherein the distance between the bottom of each of the plurality of trenches and the semiconductor substrate immediately under each trench is greater than the thickness of the gate insulating film.

3. The semiconductor device according to claim 1, wherein the distance between the trench closest to the source region and the edge of the separation insulating film on the side of the source region is greater than the thickness of the gate insulating film.

4. The semiconductor device according to claim 1, wherein each of the trenches reach the bottommost of the layered insulating films, and wherein the bottommost layer extends toward the drain region underneath a layer of the other of the plurality of layered insulating films of the separation insulating film.

5. The semiconductor device according to claim 1, wherein a layer of the separation insulating film is made of a silicon nitride film.

6. The semiconductor device according to claim 1, wherein each trench of the plurality of trenches is disposed as a slit extending in a direction orthogonal to a thickness direction of the semiconductor device.

7. The semiconductor device according to claim 1, wherein the trenches of the plurality of trenches are disposed according to a grid pattern.

8. A semiconductor device comprising:
a semiconductor substrate;
a source region of a first conductivity type paired with a drain region of the first conductivity type, the source region and the drain region disposed over a principal plane of the semiconductor substrate;

a separation insulating film embedded in an isolation trench formed over the principal plane of the semiconductor substrate between the source region and the drain region;

a gate insulating film disposed over the semiconductor substrate between the separation insulating film and the source region;

a gate electrode disposed in a manner extending immediately above the gate insulating film and immediately above the separation insulating film between the source region and the drain region;

a drift region of the first conductivity type disposed in the semiconductor substrate under the separation insulating film, one edge of the drift region being located immediately under the gate insulating film; and a trench disposed over the upper surface of the separation insulating film, the trench having the gate electrode partially embedded therein, wherein the interval between the gate electrode and the drain region is longer than the interval between the gate electrode and the source region;

wherein the trench is located away from an edge of the separation insulating film on the source region side of the separation insulating film, and the trench is disposed away from an edge of the gate electrode that is on the drain region side, wherein the bottom of the trench is positioned halfway through the depth of the separation insulating film, wherein the separation insulating film has a structure made of a plurality of layered insulating films, and wherein the first conductivity type is an N-type conductivity.

9. The semiconductor device according to claim 8, wherein a plurality of the trenches are formed over the upper surface of the separation insulating film.

10. The semiconductor device according to claim 9, wherein the depth of the trench is at least one-third of the thickness of the separation insulating film, and wherein the distance between the bottom of the trench and the semiconductor substrate immediately under the trench is greater than the thickness of the gate insulating film.

11. The semiconductor device according to claim 9, wherein the distance between the trench and the edge of the separation insulating film on the side of the source region is greater than the thickness of the gate insulating film.

12. The semiconductor device according to claim 9, wherein the trench reaches the bottommost of the layered insulating films, and wherein the bottommost layer extends toward the drain region underneath a layer of the other of the plurality of layered insulating films of the separation insulating film.

13. The semiconductor device according to claim 9, wherein a layer of the separation insulating film is made of a silicon nitride film.

* * * * *